United States Patent [19]
Ota

[11] Patent Number: 5,570,226
[45] Date of Patent: Oct. 29, 1996

[54] OPTICAL LINK AMPLIFIER AND A WAVELENGTH MULTIPLEX LASER OSCILLATOR

[75] Inventor: Takeshi Ota, Kanagawa, Japan

[73] Assignee: Fuji Xerox Co., Ltd., Tokyo, Japan

[21] Appl. No.: 418,414

[22] Filed: Apr. 7, 1995

Related U.S. Application Data

[60] Division of Ser. No. 184,137, Jan. 21, 1994, Pat. No. 5,523,879, which is a continuation-in-part of Ser. No. 873,448, Apr. 24, 1992, Pat. No. 5,510,920.

[30] Foreign Application Priority Data

| Apr. 26, 1991 | [JP] | Japan | 3-97406 |
| Jun. 28, 1991 | [JP] | Japan | 3-158580 |
| Sep. 30, 1991 | [JP] | Japan | 3-251677 |
| Oct. 7, 1991 | [JP] | Japan | 3-259429 |

[51] Int. Cl.$^6$ .......................... H01S 03/00; H01S 03/08; H04B 10/20
[52] U.S. Cl. .......................... 359/333; 359/120; 372/92
[58] Field of Search .......................... 359/121, 120, 359/130, 178, 188, 333, 342, 394; 372/92

[56] References Cited

U.S. PATENT DOCUMENTS

| 4,547,879 | 11/1983 | Namelin . | |
| 4,768,848 | 9/1988 | Vaerewyck . | |
| 4,886,334 | 12/1989 | Aoki . | |
| 4,959,829 | 9/1990 | Griesing . | |
| 5,073,982 | 12/1991 | Viola . | |
| 5,107,492 | 6/1990 | Roux . | |
| 5,124,983 | 6/1992 | Landez . | |
| 5,134,671 | 7/1992 | Koren et al. . | |
| 5,144,466 | 9/1992 | Nakamura . | |
| 5,172,373 | 12/1992 | Suzuki . | |
| 5,228,103 | 7/1993 | Chen et al. | 385/14 |
| 5,233,453 | 8/1993 | Sivarajan et al. . | |
| 5,282,257 | 1/1994 | Ota | 385/46 |
| 5,355,237 | 10/1994 | Lang et al. | 359/130 |
| 5,414,554 | 5/1995 | Aoyama . | |

FOREIGN PATENT DOCUMENTS

| 0106021 | 6/1984 | Japan . |
| 62-22891 | 10/1987 | Japan . |
| 3-296332 | 12/1991 | Japan . |
| 8505241 | 11/1985 | WIPO . |

OTHER PUBLICATIONS

"A Multichannel Grating Cavity Laser for Wavelength Division Multiplexing Applications", White, I. H., Journal of Lightwave Technology, vol. 9, No.7, pp. 893–899, Jul. 1991.
"Tuneable Multiwavelength Semiconductor Laser with Single Fibre Output", Farries et al., Electronics Letters, vol. 27, No. 17. pp. 1498–1499, Aug. 1991.
"Four Channel Multiple Wavelength Laser Transmiter Module for 1550 nm WDM Systems", Pratt et al., Electronics Letters, vol. 28, No. 11, pp. 1066–1067, May 1992.
"Wavelength–selectable Laser Emission from a Multistripe Array Grating Integrated Cavity Laser", Soole et al., Appl. Phys. Lett., vol. 61, No. 23 pp. 2750–2752, Dec. 1992.
"Four Channel Multiwavelength Source with Individually Addressable Elements", Foster et al., Electronics Letter, vol. 29, No. 10, pp. 930–931, May 1993.
"Fibernet; Multimode Optical Fibers for Local Computer Networks," by E. Rawson, IEEE, vol. Com. 26, No. 7, Jul. 1978, pp. 983–990.
"Optical Fiber Amplifier", by M. Horiguchi, Kogaku, vol. 19, No. 5 May 1990, p. 276–282.

(List continued on next page.)

Primary Examiner—Mark Hellner
Attorney, Agent, or Firm—Finnegan, Henderson, Farabow, Garrett & Dunner, L.L.P.

[57] ABSTRACT

The present invention provides an optical link amplifier which reduces the attenuation of the optical signal passing through optical an link amplifier so as to have a fail-safe function to ensure the communication path of an optical signal even if abnormality occurs at an optical amplifier, and an wavelength multiplex laser oscillator in which the spectrum width of the laser beam is narrow and coupling coefficient with an optical fiber is increased.

14 Claims, 19 Drawing Sheets

OTHER PUBLICATIONS

"Studies on Semiconductor Laser Amplifiers Unused in Optical Communication Systems," Shimada and Nakagawa: O plus E. No. 117, Aug. 1989, pp. 106–111.

"Method of Preparation Optical Waveguides with High Molecular Materials", Takado et al., O Plus E, pp. 78–83, Nov. 1984.

Simultaneous CW Operation of 5–Wavelength Integrated GAInAsP/InP DFB Laser Array wih 50Å Lasing Wavelength Separation, Okuda et al., Japanese Journal of Applied Physics, vol. 23 No. 12, pp. L904–L906 Dec. 1984.

"Dry Etching of III–V Semiconductors, " Butsuri, O., vol. 54, No. 11, pp. 1136–1153, 1985.

"Semiconductor Laser Amplifiers", Mochizuki, K., vol. 18, No. 6, pp. 297–302, Jun. 1989.

"Studies on Semiconductor Laser Amplifiers Used in Optical Communication Systems", Shimada et al., O Plus E, No. 117, pp. 106–111, Aug. 1989.

"Multichannel Wavelength–Switched Transmitters and Receivers–New Components Concepts for Broad–Band Networks and Distributed Switching Systems", Kirby, P.A., Journal of Lightwave Technology, vol. 8, No. 2, pp. 202–211, Feb. 1990.

"Optical Fiber Amplifier", Horiguchi, M., vol. 19, No. 5, pp. 276–282 May 1990.

Demonstration of a 1 × 2 Multichannel Grating Cavity Laser for Wavelength Division Multiplexing (WDM) Applications, White et al., Electronics Leters, vol. 26, No. 13, pp. 832–834, Jun. 1990.

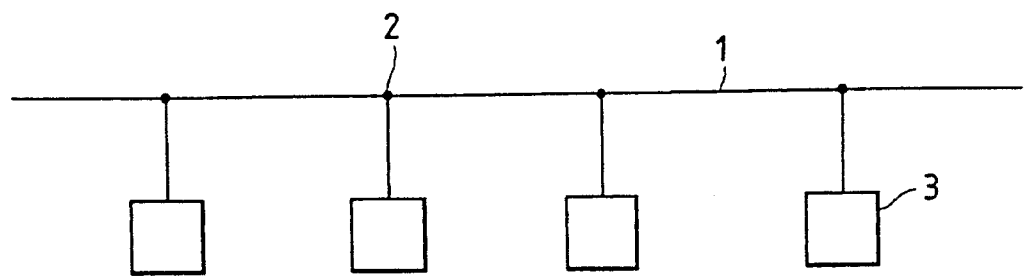
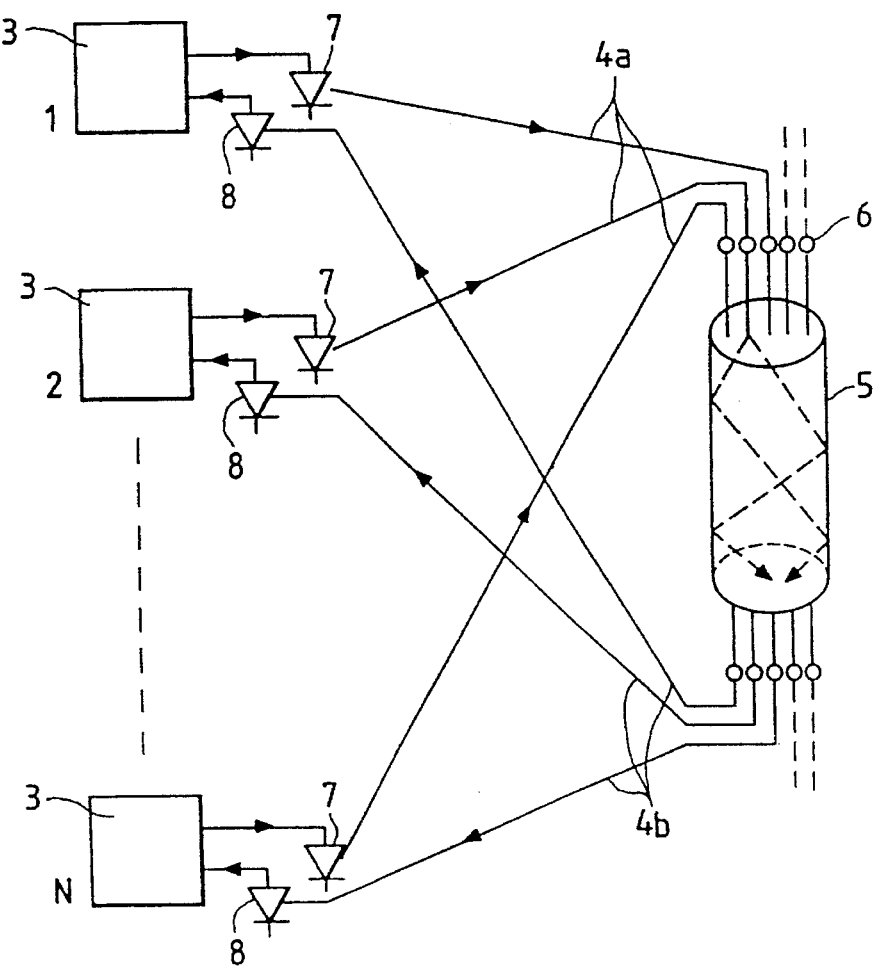

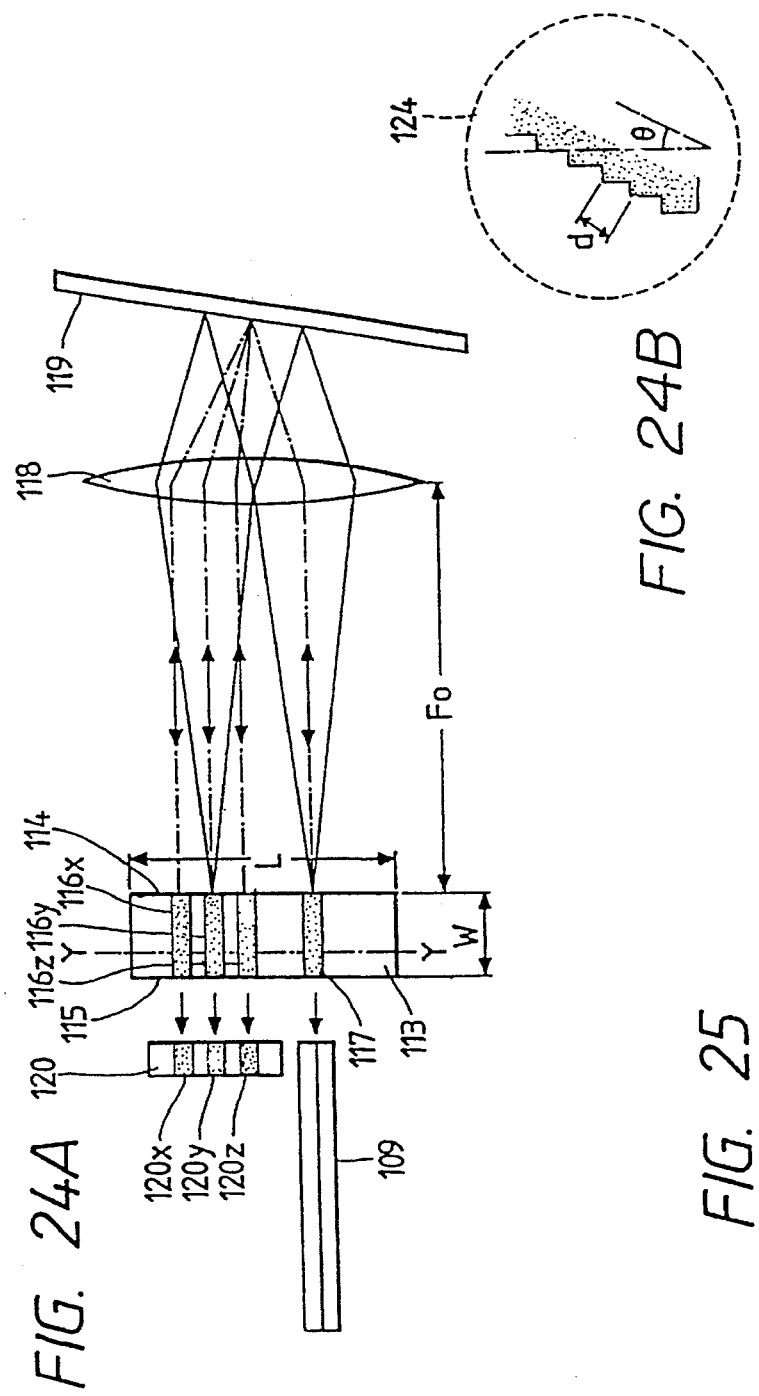
FIG. 24A
FIG. 24B
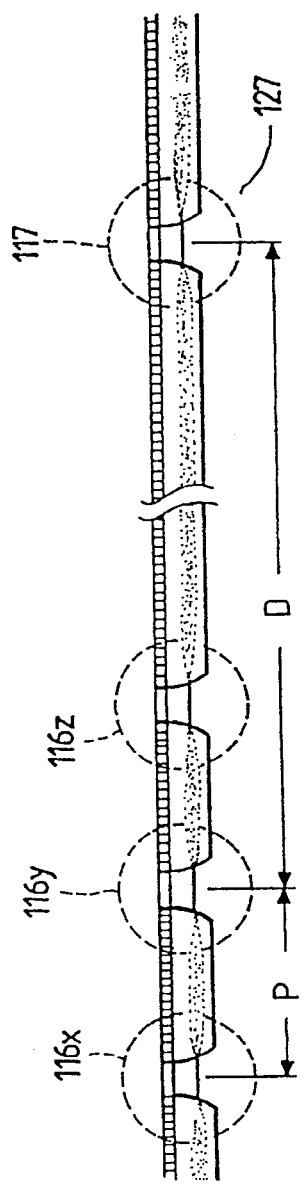
FIG. 25

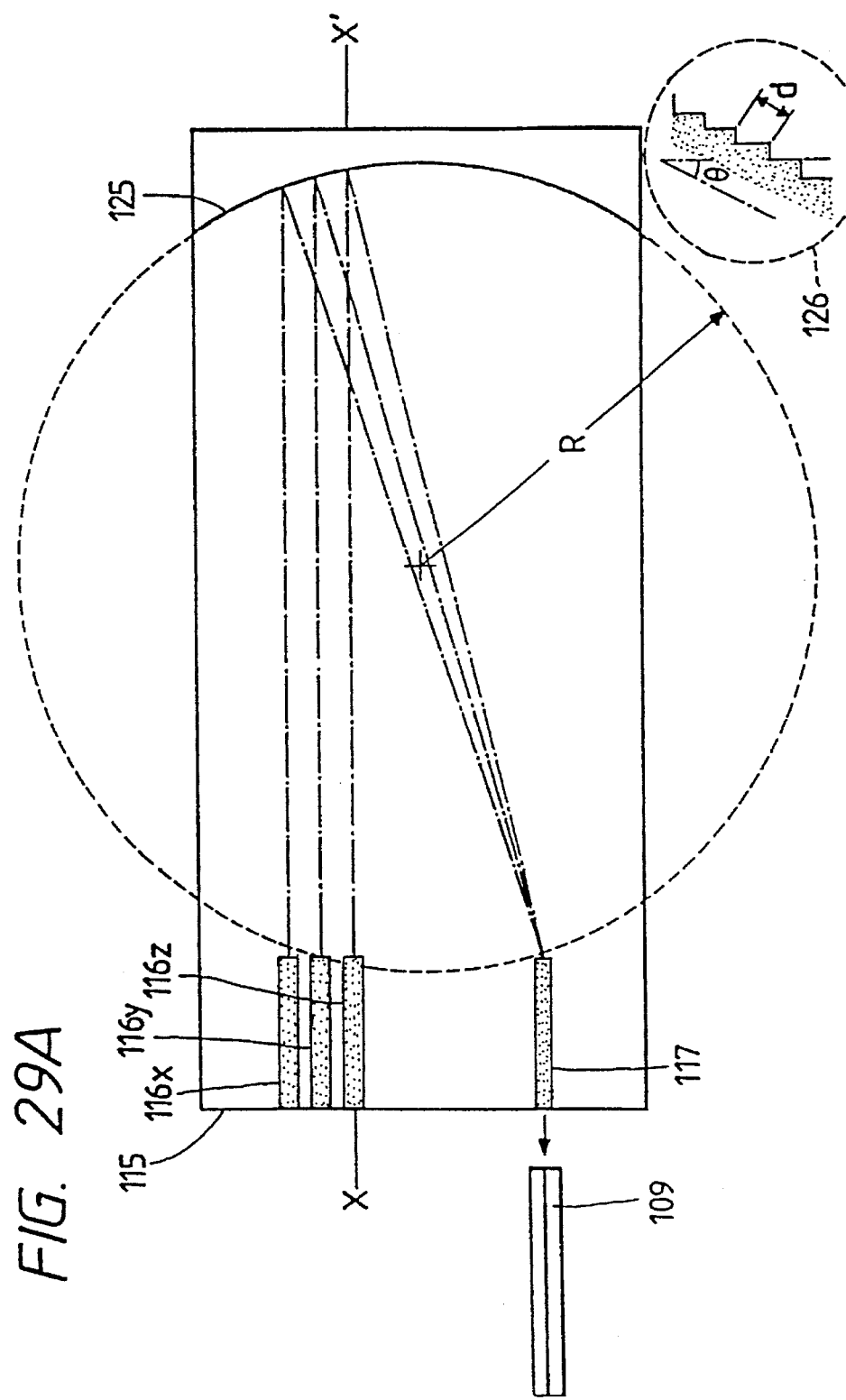

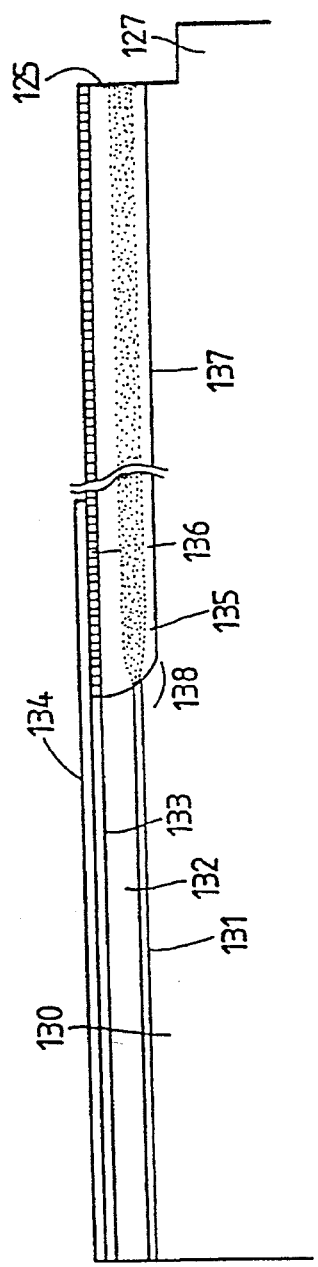
FIG. 30
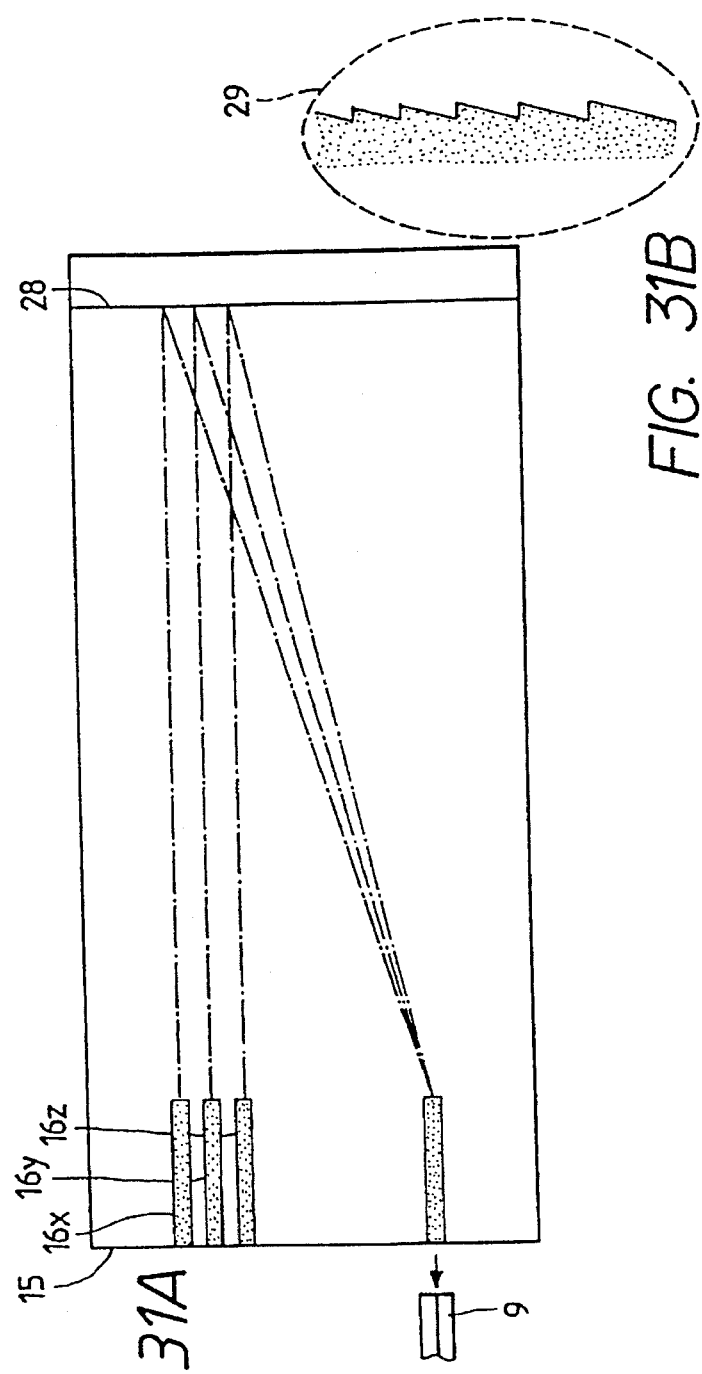
FIG. 31A
FIG. 31B

OPTICAL LINK AMPLIFIER AND A WAVELENGTH MULTIPLEX LASER OSCILLATOR

This is a division of application Ser. No. 08/184,137, now U.S. Pat. No. 5,523,879 filed Jan. 21, 1994, which is a continuation-in-part of application Ser. No. 07/873,448, filed on Apr. 24, 1992.

BACKGROUND OF THE INVENTION

1. Field of the Invention

The present invention relates to an optical link amplifier which is employed in an optical communication network, especially an optical link amplifier which has a large insertion loss such as a semiconductor laser amplifier, and a wavelength multiplex oscillator, more particularly a wavelength multiplex laser oscillator which is a component used for wavelength multiplex transmission in an optical communication.

2. Description of the Related Art

There is a growing trend in recent years to employ local area networks (LANs) as data communication networks among relatively closely installed computers, workstations, etc. One of such LANs is Ethernet® developed by Xerox Corporation.

FIG. 1 is a diagram showing an Ethernet®-based network. In FIG. 1, reference numerals designate: a coaxial cable; 2, taps (branches); and 3, nodes (terminals or stations). Each node 3 is connected to the coaxial cable 1 through the tap 2. To increase nodes 3, taps 2 must be additionally provided for connection to additional nodes 3.

Meanwhile, there is a conspicuous development in optical communications using optical fibers as transmission media. The optical fiber, because of its large bandwidth, low loss, high noise resistance, makes itself suitable to LANs. However, since the optical fiber cannot provide taps as with the coaxial cable, it is difficult to configure a network similar to Ethernet®.

To overcome this problem, a network configuration has been proposed, in which terminals are provided separately for transmission and reception per node and a star coupler is employed to distribute a signal to all such nodes. See, e.g., G. Rawson, IEEE Transactions on Communications, Vol. COM-26, No. 7, July 1978, "Fibernet: Multimode Optical Fibers for Local Computer Networks."

FIG. 2 shows the proposed example of an optical communication network using a star coupler. In FIG. 2, reference numerals 4a and 4b designate optical fibers; 5, a star coupler of a mixing rod type; and 6, terminals.

A signal from each node 3 is converted into an optical signal by its corresponding light-emitting element 7 to be supplied to the star coupler 5 through its corresponding optical fiber 4a. These optical signals are all mixed all together by the star coupler 5 and then distributed to the light-receiving elements 8 through the respective optical fibers 4b, and reconverted into electric signals. The electric signals are supplied to the respective nodes 3.

Accordingly, the signal transmitted from a single Rode is transmitted to all the nodes (multiple access), thus allowing a communication network similar to Ethernet® to be implemented.

However, an optical communication network using such a star coupler has the shortcoming that the expandability of a network is limited by the number of terminals of the star coupler. This is because interconnection between star couplers results in forming a closed loop within the transmission path and this causes phenomena such as oscillation and attenuating vibration.

To avoid this problem, the network may be configured, as disclosed in the specification of Unexamined Japanese Patent Publication No. Hei. 3-296332, so that the transfer constant between the input and output terminals forming a pair can be made zero, the pair of the terminals being connected to a single node from the star coupler. This allows a plurality of star couplers to be interconnected from one to another for network expansion. Also, the network thus constructed permits bidirectional communication between two nodes, and this bidirectional communication facilitates contention detection. Further, as proposed in the co-pending U.S. patent application Ser. No. 07/813,443 filed Dec. 26, 1991, the disclosure of which is incorporated herein by reference, the number of optical fibers, optical connectors, and link amplifiers can be almost halved by making a single terminal support the function of inputting and outputting, instead of arranging an input terminal and an output terminal separately.

By the way, a transmission control procedure for transmitting signals (hereinafter referred to as "protocol") is generally specified for each communication network. The protocol adopted by Ethernet® is of a contention system.

In a signal transmission conforming to a contention protocol in the FIG. 1 network, it is checked that there is a signal transmitted from another node on the bus, i.e., the coaxial cable 1 to transmit a signal from a node 3. If no signal is present on the bus, the node initiates transmission, and if a signal is present, the node does not transmit but waits. Therefore, the bus is used on a first-come-first-served basis. It is for this reason that this type of protocol is called a contention protocol. The protocol employed by Ethernet® is called CSMA/CD (Carrier Sense Multiple Access/Collision Detection), and is based on the above control procedure.

This contention protocol allows the bus to be efficiently used in terms of time, making itself suitable to data communication. However, LANs that adopt the contention protocol are not suitable for transmission of signals such as audio and video signals requiring realtime operation. These audio and video signals, etc., once their transmission has been initiated, must be transmitted by a predetermined amount (e.g., in the order of several K bits) at least before a predetermined short time (e.g., in the order of a millisecond) elapses to provide smooth sound and images. However, once transmission has been started, it is likely that the bus will be occupied by another node during transmission under this contention protocol. The contention protocol may ensure the realtime operation as long as the bus is not so busy, but this is the matter of probability, and it is a problem which must be taken care of to ensure stable communication. An optical network system, which has a long optical signal path, must have disposed an optical amplifier somewhere along the path to make up the attenuation of the optical signal. FIG. 15 shows an example of an ordinary optical communication network using optical amplifiers. A plurality of terminal units 3a, 3b, 3c are connected to an optical transmission path 1 made of, e.g., an optical fiber for transmitting an optical signal through couplers 9a, 9b, 9c, respectively, and optical link amplifiers 30a, 30b for compensating for optical signal attenuation are inserted at predetermined points along the optical transmission path 1.

Typical optical amplifiers used as optical link amplifiers include: a semiconductor laser optical amplifier and a rare earth element-doped optical fiber amplifier.

Semiconductor laser optical amplifiers use an ordinary semiconductor laser as an optical amplifier element, or operate a semiconductor laser as a traveling-wave optical amplifier by applying anti-reflecting films on both faces thereof (see, e.g., Mochizuki: "Semiconductor Laser Optical Amplifiers", kogaku, vol. 18, No. 6, (June 1989), pp. 297–302). Rare earth element-doped optical fiber amplifiers irradiate an excited beam from an exciting beam source such as a laser onto the optical fiber into which a rare earth element has been doped, and thus amplifies an input beam by keeping the optical fiber excited (see. e.g, Horiguchi: "Optical Fiber Amplifiers", kogaku, vol. 19, No. 5 (May 1990), pp. 276–282).

The semiconductor laser optical amplifier is disadvantageous in that it exhibits a larger coupling loss with optical fibers than the rare earth element-doped optical fiber amplifier and that it is subjected to a large loss when current injection is stopped. That us, the rare earth element-doped optical fiber can pass a signal beam to some extent even if the excited beam source, which is a source for amplification, is isolated, allowing the insertion loss to be maintained within 5-dB or so as long as the amplifier is well designed. In contrast thereto, the semiconductor laser optical amplifier exhibits a larger coupling loss with fibers, with an average insertion loss of 10 dB or so including an internal loss of the amplifier. The insertion loss is increased by 5 to 10 dB, resulting in a total of 15 to 20 dB when the amplifier operation is stopped.

For example, if the internal gain is 23 dB, the effective gain is 13 dB (23−10) (a gain of 20) in a normal condition, while the effective gain is −15 dB (1/31.6) in an abnormal condition, causing the output to attenuate by 38 dB (1/6300) during malfunction of link amplifier compared to that in the normal condition.

For the above reason, the semiconductor laser optical amplifier is disadvantageous in ensuring the communication path at the time of trouble, i.e., the semiconductor laser optical amplifier is unsatisfactory from the viewpoint of fail-safe function compared to the rare earth element-doped optical fiber amplifier, although the semiconductor laser amplifier is advantageous in terms of its element structure that is small and in terms of its flexible capabilities with an extensive range of amplifiable wavelengths and a wide band for selected wavelengths.

With the optical communication network shown in FIG. 15, an optical signal is transmitted in a direction indicated by an arrow A. For example, the optical link amplifier 30b failed, an output from the optical link amplifier 30b becomes 1/6300 its input. Once thus attenuated, terminal units subsequent to the optical link amplifier 30b, e.g., the terminal unit 3c, can no longer receive an optical signal of sufficient level, leading to a grave malfunction of the optical communication network.

While it is conceivable to increase an input gain on the part of the terminal unit, an excessive increase in gain degrades the signal-to-noise ratio and the waveform attributable to the normal signal being saturated. Thus, there is a limit in increasing the gain.

A wavelength multiplex light source is employed as a light emitting element in an optical communication network, and example of which is a wavelength multiplex laser oscillator.

To design wavelength multiplex systems, it has been proposed to combine a plurality of semiconductor lasers, each having a different light emitting wavelength, and an optically dividing and synthesizing means together. In such systems, the use of individual semiconductor lasers leads to the problem of increasing the number of assembling steps in proportion to an increase in the number of channels.

To overcome this problem, what has been reported is a monolithic integrated DFB (distributed feedback) laser array which integrally arranges a plurality of semiconductor lasers, each having a different light emitting wavelength, on a single substrate (e.g., see H. Okuda et al., Japanese Journal of Applied Physics, Vol. 23, No. 12, December, 1984, pp. L904–L906).

However, even if such a semiconductor laser array is employed, optical signals are emitted from light emitting spots that are different from one another, thus requiring separate means for synthesizing the light.

What has been proposed to improve this shortcoming is a wavelength multiplex light source, which can both wavelength multiplex and synthesize optical signals using a laser excited by an external resonator that combines a semiconductor laser array and a diffraction grating, the semiconductor laser array having a coating of a nonreflective film on a single light exit end surface (see Unexamined Japanese Patent Publication No. Sho. 62-229891).

Here, the principle of the oscillating of the wavelength multiplex oscillator is described as follows.

When current is first fed to the "semiconductor laser amplifier", the "semiconductor laser amplifier" emits "spontaneous emission light". This light, like the LED light, is incoherent light of a broad spectrum. Of the spontaneous emission light, the light of a specific wavelength is selectively picked up by a spectral optical system. The selected light is returned to the semiconductor laser amplifier by way of an optical route of "optical waveguide"→reflecting means→"optical waveguide"→spectral optical system. Only the selected light of the specific wavelength is amplified and travels through "semiconductor laser amplifier"→ reflecting means→"semiconductor laser amplifier"→. . . . Finally, a laser oscillation takes place.

That is, a source of the oscillation is emitted from the "semiconductor laser amplifier" and applied to "optical waveguide" by the spectral optical system.

As shown in FIG. 18, the external resonator of such conventional example described in the above publication includes a collimator lens 51, a diffraction grating 52, and a highly reflective coating 53a formed on an end surface of an optical fiber 53, and an external oscillator. Semiconductor lasers $LD_1$ to $LD_3$ formed on a semiconductor laser array 54 emit light at respectively corresponding predetermined wavelengths $\lambda_1$ to $\lambda_3$. Reference character 54a designates a anti-reflective coating provided on one light exit end surface of the semiconductor laser array 54. A laser beam from each of the lasers $LD_1$ to $LD_3$ is diffracted by the diffraction grating 52 via the collimator lens 51 and is thereafter reflected again by the highly reflective coating 53a provided on the end surface of the optical fiber 53 via the collimator lens 51. The reflected laser beams return to the lasers $LD_1$ to $LD_3$ following the reverse path. The laser beams returning to the respective lasers have wavelengths $\lambda_1$ to $\lambda_3$ satisfying both predetermined angles $\theta_1$ to $\theta_3$ corresponding to the lasers $LD_1$ to $LD_3$ and a diffractive condition $d \sin \theta_i = n \lambda_i$ (where d is the distance between lines of the diffraction grating, and n is an integer). Therefore, individual semiconductor lasers $LD_1$ to $LD_3$ come to emit light at the corresponding predetermined wavelengths $\lambda_1$ to $\lambda_3$. Further, the laser beams from the lasers $LD_1$ to $LD_3$ are all injected onto the single optical fiber 53, so that the configuration shown in FIG. 18 serves also as a synthesizer. Reference character L in FIG. 18 designates a wavelength multiplex laser beam; $\theta_0$, an angle formed between the normal to the diffraction grating 52 and an optical path from the diffraction grating 52 toward the optical fiber 53.

In the wavelength multiplex system, it is desirable that the wavelength width of a laser be narrow to facilitate not only the separation of respective wavelengths but also the optical processing of the light beam of each wavelength. In the conventional art disclosed in the above Unexamined Japanese Patent Publication No. Sho. 62-229891, however, the oscillation wavelength of a laser is equal to a wavelength bandwidth (spectral bandwidth) proportional to the diameter of the cross section of an optical fiber, thereby imposing the problem that it is difficult to narrow the wavelength bandwidth due to physical restrictions in the diameter of the cross section of an optical fiber. In addition, there has existed the problem that the coupling efficiency with the optical fiber is low. These problems will now be described below.

The reason why the oscillation wavelength of a laser has a wavelength bandwidth that is proportional to the diameter of the cross section of an optical fiber is as follows. As shown in FIG. 18, since the end surface of the optical fiber 53 provided with the highly reflective coating 53a is in an optically conjugate relation with the respective lasers $LD_1$ to $LD_3$ with respect to the spectral system formed of the collimator lens 51 and the diffraction grating 52, the diffracting conditions differ from one position to another on the end surface of the optical fiber 53. For this reason, the laser beam whose wavelength bandwidth (spectral bandwidth) is proportional to the diameter of the cross section of the optical fiber 53 starts oscillating.

FIG. 19 is an enlarged diagram showing the highly reflective coating 53a side Of the optical fiber 53. If it is assumed that the diameter of the optical fiber 53 consisting of a core 53b and a clad 53c is 2r, then a laser beam whose center wavelength is $\lambda_0$ oscillates at a wavelength bandwidth ranging from a wavelength ($\lambda_0+\delta\cdot r$) to a wavelength ($\lambda_0-\delta\cdot r$), depending on the diffracting condition at a position on the end surface, where $\delta$ is the proportional coefficient, which is equivalent to a reciprocal of the focal distance of the collimator lens 51.

While it is conceivable to narrow the wavelength bandwidth by decreasing the diameter of the optical fiber 53, predetermined standards prescribed on optical fibers for communication use do not easily permit the wavelength bandwidth of an optical fiber to be narrowed by changing its cross sectional structure.

The reason why the coupling efficiency with the optical fiber is low will be described next. A cross sectional structure of an ordinary optical fiber is shown in FIG. 20(a) and FIG. 20(b). FIG. 20(a) shows the cross sectional structure of a multimode fiber, with the outer diameter $2R_f$ of its clad 53c being 125 μm and the diameter $2R_m$ of its core 53b being 50 μm. FIG. 20(b) shows the cross sectional structure of a single mode fiber, with the outer diameter $2R_f$ of its clad 53c being 125 μm and the diameter $2R_s$ of its core 53b being 10 μm. If such a wavelength multiplex light source as shown in FIG. 18 is configured using these optical fibers, an emission spectrum of the laser oscillator is as shown in FIG. 21. That is, the wavelength bandwidth of a laser beam to be coupled with the core of a multimode fiber whose core diameter is $2R_m$ is $\Delta\lambda_m$, while the wavelength bandwidth of a laser beam to be coupled with the core of a single mode fiber whose core diameter is $2R_s$ is $\Delta\lambda_s$.

In the case where the multimode fiber such as shown in FIG. 20(a) is used, the amount of light to be coupled with the core 53b of the fiber (a region shaded by slants in FIG. 21) is large, but the spectral bandwidth of a laser beam is wide. Conversely, in the single mode fiber such as shown in FIG. 20(b), the spectral bandwidth of a laser beam is narrow, but the amount of light to be coupled with the core 53b of a fiber (a region shaded by intersections in FIG. 21) becomes small. Therefore, the coupling efficiency with the optical fiber is particularly decreased when the single mode fiber is used.

SUMMARY OF THE INVENTION

Accordingly, an object of the present invention is to ensure a communication path for an optical signal and thereby provide a fail-safe function in the event of an abnormality by reducing the attenuation of the optical signal passing through an optical link amplifier even if the abnormality occurs at an optical amplifier.

The above object of the present invention is accomplished by the provision of an optical link amplifier comprising a substrate and an optical waveguide, formed integral with the substrate, which includes an amplifier/branching circuit having an optical link amplifier, a bypass circuit, and a coupling area for optically coupling together said amplifier/branching circuit and said bypass circuit, wherein the branching width of said amplifier/branching circuit is smaller than that of said bypass circuit.

The other object of the present invention is to provide a wavelength multiplex laser oscillator capable of narrowing the spectral bandwidth of its laser beam and having high coupling efficiency with an optical fiber.

The other object of the present invention is accomplished by the provision of a wavelength multiple laser oscillator comprising an optical waveguide having first and second light emitting end faces; a laser amplifier array having first and second light emitting end faces and being disposed to physically oppose said optical waveguide, wherein a plurality of laser amplifiers, each of which is driven independently, are disposed so that the optical axes of said laser amplifiers are parallel to one another; a spectral optical system in which the first light emitting end face of said optical waveguide and the first light emitting end face of said laser amplifier array are disposed so as to have an optical conjugate relationship therebetween, and each said semiconductor laser amplifier and said optical waveguide are disposed so as to have an optical image forming relationship therebetween; and first and second reflector provided on the second light emitting end faces of each said optical waveguide and said laser amplifier array, respectively.

BRIEF DESCRIPTION OF THE DRAWINGS

In the accompanying drawings:

FIG. 1 is a diagram showing a conventional network system;

FIG. 2 is a schematic diagram illustrating a network configured using a star coupler;

FIGS. 24A and 24B are schematic diagrams showing a first embodiment of a wavelength multiplex laser oscillator of the present invention;

FIG. 25 is a sectional view taken along a line Y—Y of the first embodiment of the invention;

FIGS. 29A and 29B are schematic diagrams showing a fourth embodiment of a wavelength-multiplex laser oscillator of the present invention;

FIG. 30 is a sectional view taken along a line X—X of the fourth embodiment shown in FIG. 29;

FIGS. 31A and 31B are schematic diagrams showing a fifth embodiment of a wavelength multiplex laser oscillator of the present invention;

DESCRIPTION OF THE PREFERRED EMBODIMENTS

Embodiments of the present invention will hereunder be described with reference to the drawings.

Figure 3:
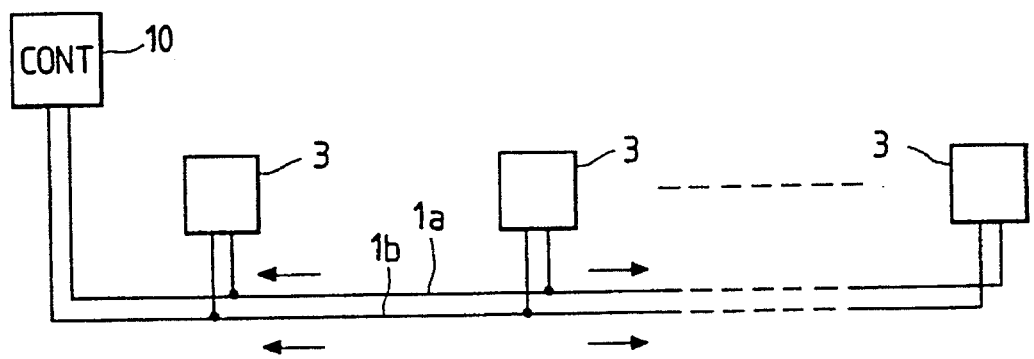
FIG. 3 is a diagram showing a first embodiment of a local area network of a multi-channel system.

FIG. 3 is a diagram showing a first embodiment of a multi-media local area network according to the present invention. In this network involving a plurality of transmission channels 3, a plurality of buses 1a, 1b are arranged and each node 3 is connected to both busses 1a, 1b as shown in FIG. 3. The bus 1a serves as a transmission channel for data communication and the bus 1b serves as a transmission channel for realtime communication for audio and video signals. A bus controller such as a time division controller 10 is provided for the realtime communication bus 1b. The time division controller 10 is also connected to the bus 1a so as to receive an instruction to start realtime transmission from the data communication transmission channel.

When a realtime communication must be made, each node requests the time division controller 10 to assign a circuit under the contention protocol through the bus 1a that serves as the data communication transmission channel. The time division controller 10 assigns a circuit based on a time division multiple access (TDMA) of a token passing type while considering the conditions of the bus 1b that it manages.

Each of the buses 1a, 1b can be formed of a coaxial cable or a twisted pair.

Transmission using the contention bus a is performed in a manner similar to the conventional example shown in FIG. 1, and therefore its description will be omitted.

In the time division system, time is divided into predetermined short time portions called "time slots" and a time slot is cyclically assigned to a node 3 that has made a transmission request. The node 3 is then allowed to transmit only for the time slots assigned to itself. The bus controller 10 generates a signal controlling the assignment of a time slot to a node 3.

Figure 4:
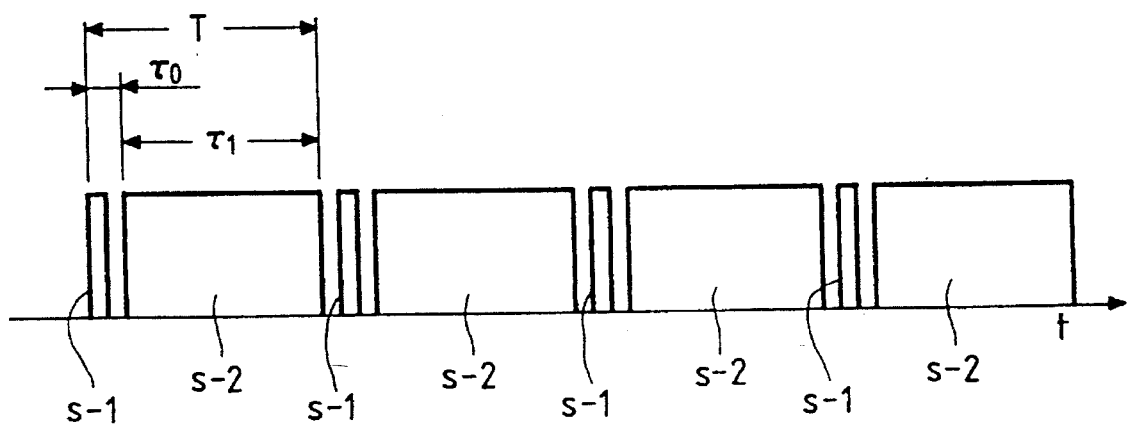
FIG. 4 is a timing chart showing how time division control is performed on a channel in accordance with a time division multiple access protocol.

FIG. 4 is a diagram illustrative of the time slot in the time division system. In FIG. 4, reference character s-1 designates a bus control signal; s-2, a node signal; and T, a time slot.

The bus controller 10 generates a single bus control signal s-1 per time slot. Each bus control signal s-1 contains a message specifying a node 3.

This bus control signal s-1 is received by all the nodes 3. However, it is only the node 3 specified by the message that is permitted to transmit within that time slot. This signal transmitted from the node 3 is the node signal s-2.

Therefore, signals are sequentially transmitted from the respective nodes 3 at a short cycle, thereby providing the realtime characteristic with the transmission.

If a certain node 3 wishes to transmit using the time division bus 1b such as described above, the node 3 sends a transmission request to the bus controller 10 through the bus 1a. That is, the transmission request is transmitted after the right to use the bus 1a has been obtained.

The bus controller 10 that has received the transmission request issues a bus control signal s-1 containing a transmission permission message. Accordingly, the node 3 can transmit audio and video signals. In the bus 1b, once transmission has been started, time slots are assigned at a predetermined short cycle until the transmission is terminated, thereby allowing the realtime characteristic of the transmission to be maintained.

If another node 3 sends a transmission request to the bus controller 10 while a certain node 3 is transmitting using the bus 2, a time slot that is not occupied by the current transmission is assigned to the node 3 requesting a transmission. Therefore, almost simultaneous transmission from a plurality of nodes 3 is enabled.

A specific example of the time slot will be described next.

Assuming that the time required for a signal to be propagated in both ways along the entire length of the bus (i.e., the "maximum round trip delay time" of a signal) is $\tau$, the time $\tau$ is determined by the size of a network (if the network is large, the time $\tau$ is also large). To allow a single having a meaning to be transmitted during a single time slot, the time slot length T must be selected to a value sufficiently larger than the time $\tau$. For example, if $\tau=50$ μs, T must be 500 μs or the like.

If T=500 μs, one second is divided into 2000 time slots. These time slots are allotted to, e.g., 20 to a first node and 50 to a second node, and so on, the nodes requesting a transmission. How the allotment of time slots is carried out depends on the instruction of the bus control signal s-1.

If the clock rate of the time division bus 1b is 100 Mbps (bit per second) and if the time available for data transmission out of a 500 μs long time slot is 300 μs, then a signal carrying 30,000 bits of data can be transmitted per time slot ($100 \times 10^6 \cdot 300 \times 10^{-6} = 30,000$).

Therefore, a node that is provided with 20 time slots per second can transmit a signal at 600 Kbps, maintaining sufficient realtime operation. A voice or motion picture can be transmitted more smoothly by assigning the 20 time slots at an equal interval within a second.

Figure 5:
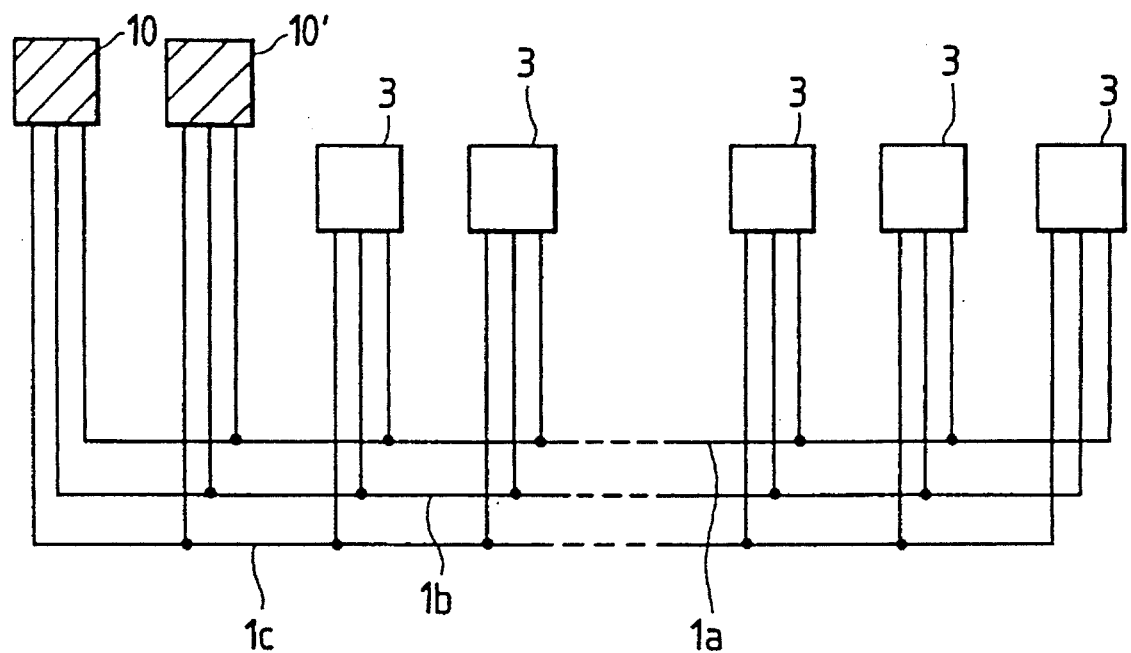
FIG. 5 is a diagram showing a second embodiment of the local area network.

FIG. 5 is a diagram showing a second embodiment of the multi-media network according to the present invention. Reference numerals used in FIG. 5 correspond to those in FIG. 3, and reference numeral 1c designates a bus; and 10', a bus controller.

The bus 1c is a bus conforming to the time division protocol in the same manner as the bus 1b in FIG. 3. The bus controller 10' is a device that controls use of the bus 1c. The bus controller 10' is also formed of, e.g., a slot generator.

An additional bus is provided in this embodiment to increase the transmission capacity of the time division bus.

All the nodes 3 and the bus controllers 10, 10' are connected to the buses 1a, 1b.

To make a transmission request by using the time division bus, such request is transmitted to the bus controllers 10, 10' via the contention bus 1a from each node 3. A rule is established between the bus controllers 10, 10' on which bus accepts the requests first so that the accepting bus allows itself to be used.

For example, bus controller 10 accepts requests first, and the bus controller 10' is allowed to accept requests when the bus 1b corresponding to the controller 10 is used up. Further, correspondence between the node and the bus controller may be preset. Even in this case, it goes without saying that once one controller has been full, additional requests must be taken care of by the other controller.

Figure 6:
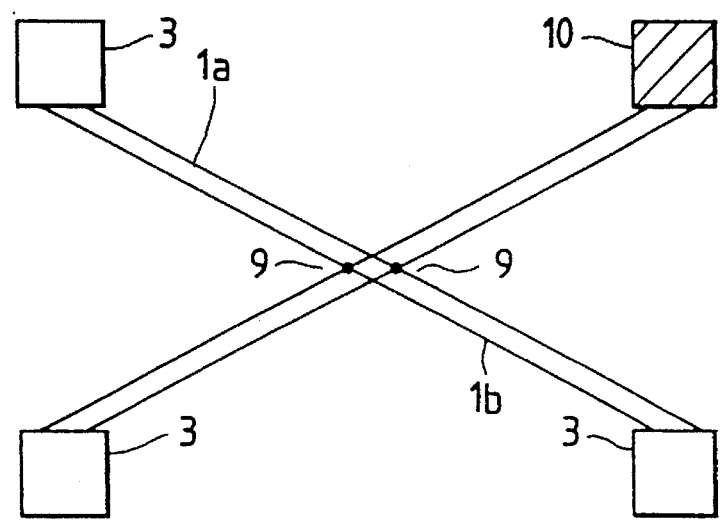
FIG. 6 is a diagram showing a third embodiment of the local area network.

FIG. 6 is a diagram showing a third embodiment of the multi-media network according to the invention. In FIG. 6, components which are the substantially same as those in FIGS. 3 and 5 bear the same reference numerals, and reference numeral 9 designates star couplers.

In this embodiment the invention is applied to a star-configured optical communication network, in which the two star couplers 9 correspond to the buses 1a, 1b in FIG. 1, respectively.

As described above, the LAN according to the invention connects all the nodes to both the bus conforming to the contention protocol and the bus conforming to the time division protocol.

In the case where transmission requests are made by a plurality of nodes, the time division bus can provide a transmittable period at a predetermined short cycle to each node. Therefore, transmission is possible even for signals requiring realtime processing such as audio and video signals.

Thus, the LAN of the invention transmits data signals not requiring realtime processing while using the contention bus for data signals, and also transmits audio and video signals requiring realtime processing while using the time division bus for audio and motion picture signals. In other words, with the LAN of the invention, the right bus is selected for the right signal.

As a result, in addition to data signals which do not require realtime processing, signals requiring realtime processing can also be transmitted smoothly.

However, the transmission method involving two transmission channels separately provided for data communication and realtime communication entails tremendous cost in configuring a network because of its provision of a plurality of buses. For example, when a coaxial cable is used for forming a bus, it goes without saying that two coaxial cables must be installed, meaning not only that the coaxial cable cost is doubled but also that the installation space is also doubled in addition to doubling the number of taps, transceivers, etc.

Figure 7:
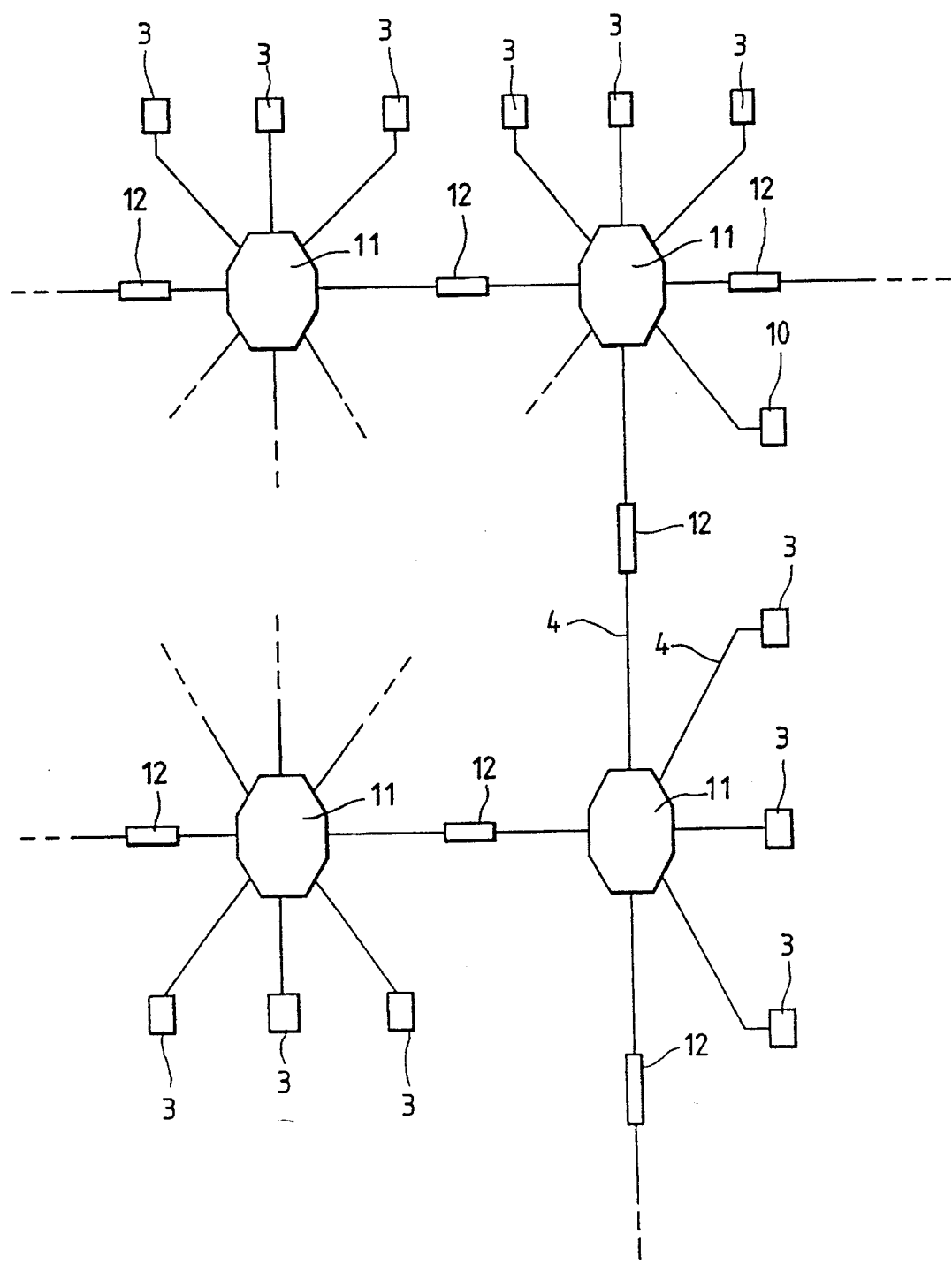
FIG. 7 is an explanatory diagram showing an example of an optical communication network of the present invention.

FIG. 7 is a diagram showing an exemplary optical communication network of the invention. In this embodiment a plurality of 8-terminal passive star couplers 11 are used to configure the network. Nodes 3 are connected to terminals of each star coupler 11 and the star couplers 11 are interconnected through link amplifiers 12. Between each node and the corresponding star coupler an optical fiber 4 is interposed. The optical fiber 4 used in this configuration is a multimode and refractive index distributed type with a core diameter of 50 μm and an outside diameter of 125 μm. Similarly, an optical fiber 4 is interposed between the star coupler 11 and the link amplifier 12.

Figure 8:
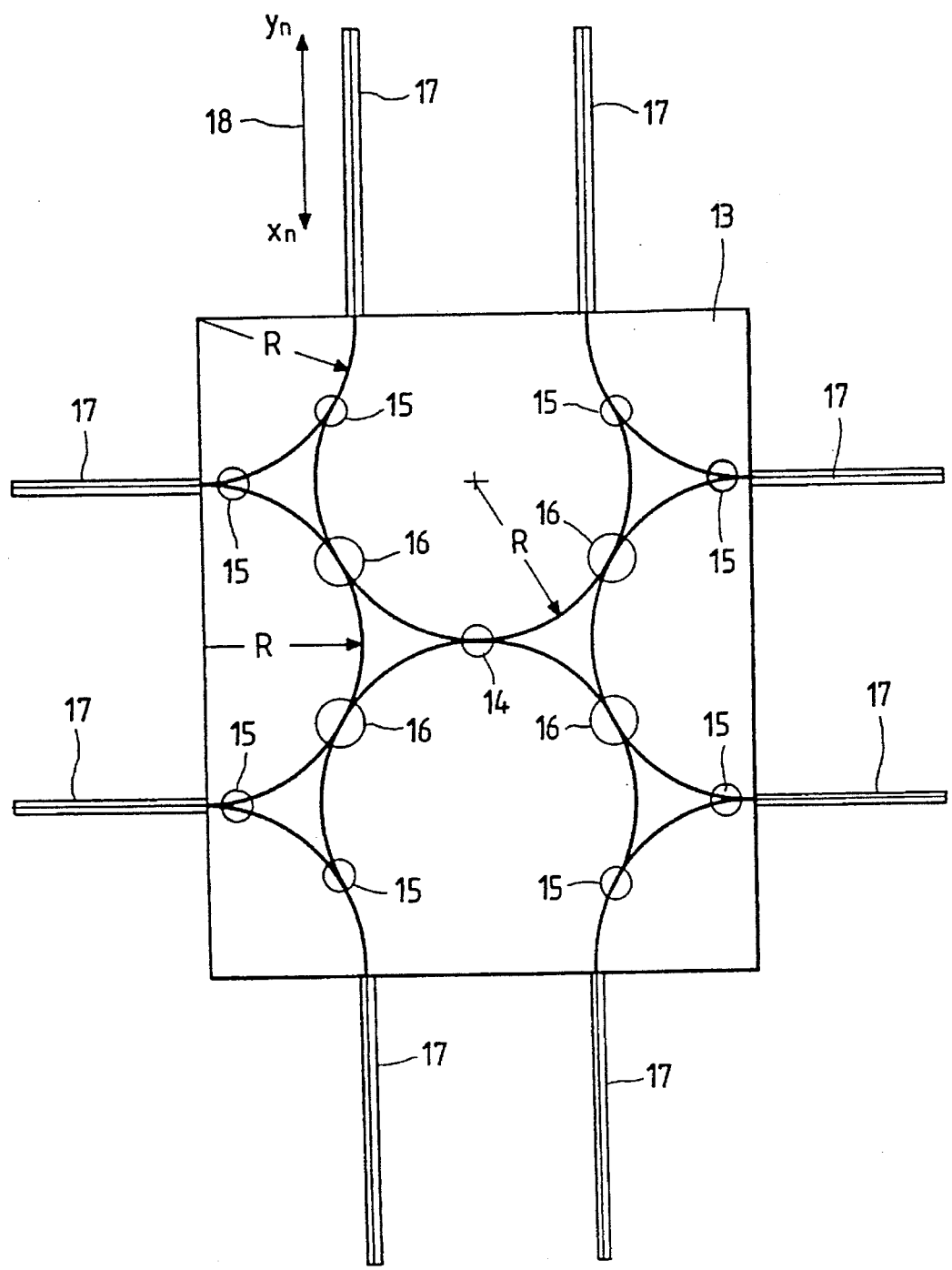
FIG. 8 is a plan view of an 8-terminal passive star coupler to be used in the FIG. 7 optical communication network.

The 8-terminal star coupler 11 has a structure such as shown in FIG. 8. An optical integrated circuit including waveguides is formed on a substrate made of glass or polycarbonate and a predetermined distribution ratio is provided. In FIG. 8 reference numeral 14 designates a 2×2 optical equally distributing unit; 15, a 1×2 optical unequally distributing/synthesizing unit; 16, a 2×2 optical unequally distributing unit; 17, an optical fiber; R, a radius of curvature of an optical waveguide; and $x_n$, $y_n$, input and output components, respectively. The term "1×2," e.g., means that there is a single optical path on one side with respect to two optical paths on the other side.

Figure 9:
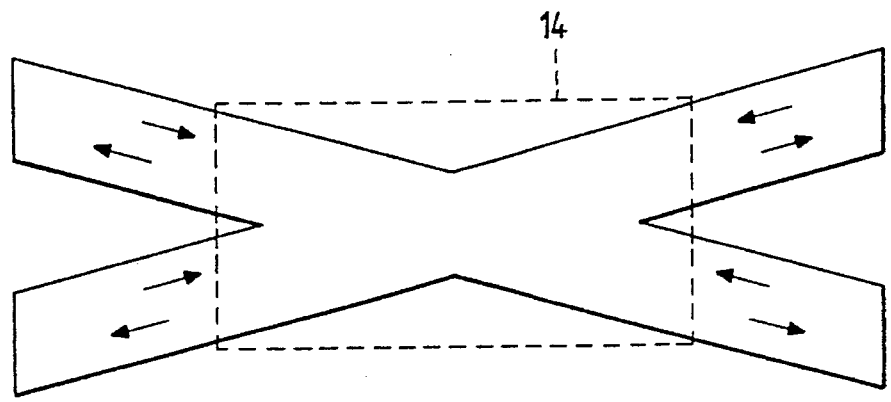
FIG. 9 is a plan view of a 2×2 optical equally distributing unit.
Figure 10:
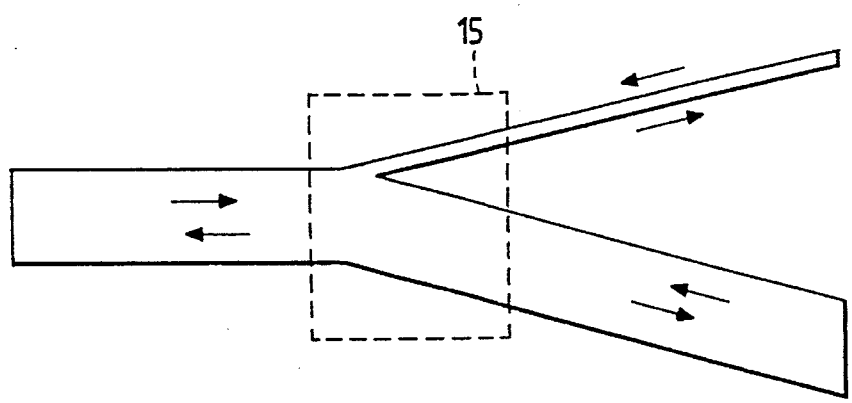
FIG. 10 is a plan view of a 1×2 optical unequally distributing/synthesizing unit.
Figure 11:
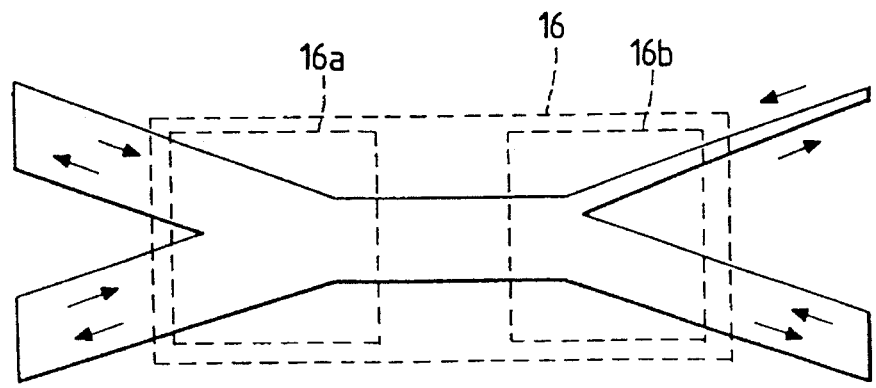
FIG. 11 is a plan view of a 2×2 optical unequally distributing unit.

FIG. 9 schematically shows a structure of the 2×2 optical equally distributing unit 14; FIG. 10 schematically shows a structure of the 1×2 optical unequally distributing/synthesizing unit 15; and FIG. 11 schematically shows a structure of the 2×2 optical unequally distributing unit 16.

As shown in FIG. 9, in the 2×2 optical unequally distributing unit 14, the widths of all its waveguides are set to an equal value. Similarly, as shown in FIGS. 10 and 11, each of the 1×2 optical unequally distributing/synthesizing unit 15 and the 2×2 optical unequally distributing unit 16 has waveguides whose widths are different in accordance with selected distribution ratios. The 2×2 optical unequally distributing unit 16 consists of a 1×2 optical equally distributing/synthesizing unit 16a and a 1×2 optical unequally distributing/synthesizing unit 16b.

The above structure of the star coupler 11 is, as disclosed in detail in the specification of the co-pending U.S. patent application Ser. No. 07/813,443 referred hereinbefore, can be implemented by a method of forming optical waveguides by diffusing thallium (Tl) ions, etc., on a glass substrate, a method of forming optical waveguides by irradiating ultraviolet rays onto polycarbonate for selective polymerization and prepare an refractive index profile, by combining fused couplers, etc.

In the FIG. 8 star coupler 11, an optical signal 18 inputted through an optical fiber 17 is sequentially distributed to the 1×2 optical unequally distributing/synthesizing units 15, the 2×2 optical unequally distributing units 16; the 2×2 optical equally distributing unit 14 at predetermined ratios to be supplied to the other optical fibers 17. An optical signal from another optical fiber is supplied to the optical fiber 17 while synthesized at predetermined ratio.

Figure 12:
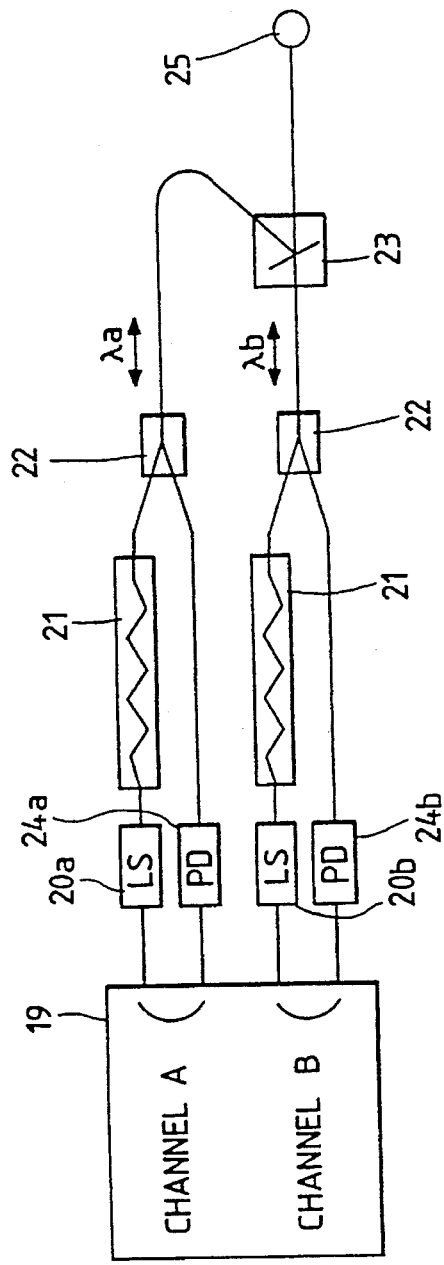
FIG. 12 is a diagram showing an example of an internal structure of a node to be used in the FIG. 7 optical communication network.

Each node 3 has a structure shown in FIG. 12. Transmission signals for two channels from the main body 19 of the node 3 are converted into optical signals by light sources 20a, 20b and then transmitted to the network from a port 25 after they have been through with mode scramblers 21 and 1×2 optical equally distributing/synthesizing units 22, respectively, and have met at a wavelength multiplexing distributing/synthesizing unit 23. Each mode scrambler 21 has optical waveguides arranged zigzag and serves to prevent inconsistency in the distribution ratios of the passive star couplers by distributing the optical signals from the light sources 20a, 20b to each mode of the multimode optical fiber as consistently as possible.

The wavelengths emitted from the light sources 20a, 20b are different; the wavelength $\lambda_a$ emitted from the light source 20a is selected to be 780 nm and the wavelength $\lambda_b$ emitted from the light source 20b is selected to be 870 nm in this embodiment. The light sources 20a, 20b are formed of AlGaAs Fabry-Perot semiconductor lasers; light-emitting diodes may, of course, replace them. Let a channel that transmits the wavelength $\lambda_a$ be channel A and a channel that transmits the wavelength $\lambda_b$ be channel B.

Signals received from the network are transmitted to and distributed at the wavelength multiplexing distributing/synthesizing unit 23 via the port 25. The distributed optical signals are inputted to light-receiving units 24a, 24b via the 1×2 optical equally distributing/synthesizing units 22 (see FIG. 13). The light-receiving units 24a, 24b are formed of silicon avalanche photodiodes (Si-APD). About a half of the optical signals are transmitted to the optical sources 20a, 20b as a loss.

The wavelength multiplexing distributing/synthesizing unit 23 is an element serving to distribute an optical signal whose wavelength is $\lambda_a$ to the channel A and an optical signal whose wavelength is $\lambda_b$ to the channel B. The wavelength multiplexing distributing/synthesizing unit 23 is of an interference filter type, which is commercially available. Since the FIG. 7 star coupler 11 is of the passive type, even if signals with different wavelengths are mixed, it can distribute the signals without interference.

Figure 13:
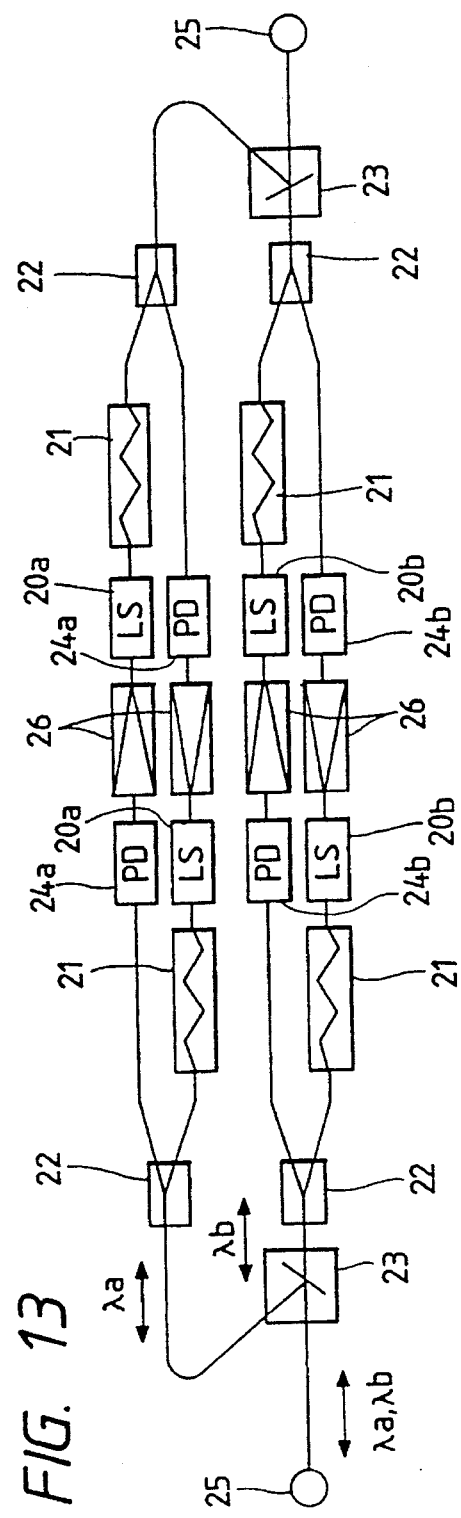
FIG. 13 is a diagram showing another example of an internal structure of a link amplifier used in the FIG. 7 optical communication network.

Each link amplifier 12 has a structure such as shown in FIG. 13. Optical signals inputted from one of the ports 25 are separated by the wavelength multiplexing distributing/synthesizing unit 23 at the wavelength, converted into electric signals at the light-receiving units 24a, 24b, and subjected to amplification and waveform shaping at reproducing amplifiers 26. Thereafter, the thus processed electric signals are reconverted into optical signals having the respective wavelengths at the optical sources 20a, 20b, synthesized at the wavelength multiplexing distributing/synthesizing unit 23, and transmitted to the other port 25. As is apparent from FIG. 13, the link amplifier 12 serves as a bidirectional link amplifier. The link amplifier 12 may be provided with functions such as so-called 1R, 2R, and 3R, as necessary. The 1R function means resharping of a signal; the 2R function means 1R function plus retiming of a signal; and the 3R function means the 2R function plus regeneration of the signal.

The amplifier such as shown in FIG. 13, which amplifies an optical signal after converting it into an electric signal is called a link reproducing amplifier. A semiconductor laser amplifier, which is a bidirectional optical amplifier, may be used as the link amplifier 12. For semiconductor laser amplifiers, see "Studies on Semiconductor Laser Amplifiers Used in Optical Communication Systems" by Shimada and Nakagawa (O plus E, August 1989, pp. 106–111). In this case, since the wavelength range which a semiconductor laser amplifier has gain is 50 nm (−3 dB) or so, the difference between $\lambda_a$ and $\lambda_b$ must be set to about 30 nm. Thus, if a semiconductor laser amplifier is to be used as a link amplifier 12, then $\lambda_a$ is set to, e.g., 780 nm and $\lambda_b$ to 810 nm, and the optical sources 201a, 20b must be formed of distributed feedback (DFB) semiconductor lasers whose oscillation wavelength is stable. The reason for this is that the Fabry-Perot semiconductor laser has a temperature-dependent wavelength variation of about 0.3 nm/° C. The wavelength of an optical signal may not be around 800 nm; e.g., wavelengths of 1.3 μm band and 1.6 μm band may be used. There is no particular reason for using an optical signal having a predetermined wavelength in configuring this optical communication network.

Similarly, with respect to the optical fiber, one having a different core diameter, or a single-mode type instead of a multimode type, may be used. However, in these cases, components such as the optical sources, light-receiving elements, star couplers, etc., must be redesigned. While erbium element doped fiber amplifiers are known as a bidirectional optical amplifier, in addition to the semiconductor laser amplifiers, since the wavelength range which the former amplifiers have gain is as short as about 2 nm (−3 dB), it is difficult, if not impossible, to multiplex wavelengths. In the above description, the optical signal has a return-to-zero (RZ) format. This signal format must be distinguished from nonreturn-to-zero (NRZ) signals that are occasionally used in optical communication networks.

An embodiment, in which a multi-channel LAN is configured using the optical communication network of the invention, will be described.

The LAN in this embodiment can be implemented by specifying the channel A as a channel that conforms to a contention protocol for data communication and the channel B as a channel that conforms to a time division multiple access (TDMA) protocol for audio and video signal communication in the above multi-channel optical communication network. The signal transmission rate of the-channel A is set to 10 Mbps; its coding format is based on the Manchester code; and its protocol conforms to IEEE 802.3. A collision is detected when a carrier has been sensed during transmission. The signal transmission rate of the channel B is set to 100 Mbps; its coding format is based on the 4B5B code; and its protocol conforms to a token passing system. From the characteristic of the 4B5B coding that the 4-bit data is codified into a 5-bit code, the carrier frequency is 125 Mbps. A token is produced only by the time division controller 10 shown in FIG. 7. The time division controller 10 is identical with the general node 3 in terms of hardware.

Each node 3 first requests the time division controller 10 to assign a circuit through the channel A. The time division controller 10 assigns a circuit in accordance with a predetermined algorithm based on the request and the circuit conditions.

As shown in FIG. 4, the signal on the channel B at a certain point in the network is presented with the abscissa indicating time. A circuit is assigned by sending a short packet S-1 called a "token" at a predetermined cycle on the channel B. The term "packet" means a group of code strings, named after a packet to be mailed. The token includes the address of a node to which transmission is permitted to be directed. When a node receives a token addressed to itself and including a transmission permission for itself, such node transmits a packet S-2 immediately. In such a case, the packet length is preset to a predetermined length $\tau_1$.

In this embodiment the time division controller 10 divides one second into 1000 time slots (slot length T=1 ms) and assigns them to respective nodes requesting the assignment of a circuit. Therefore, a token is sent every 1 ms in this embodiment. A standard assignment is such that 20 time slots are given to a single node per second, with a signal delay time being about 50 ms. Since the maximum round trip delay time of the network is set to 46.5 µs, which is the Ethernet® standard, a dead time $\tau_0$ of about 250 µs per time slot must be taken in account as a time required for token transmission through the network and for control. Considering this dead time, the packet length $\tau_1$ is set to about 750 µs. Therefore, a single packet includes approximately 75K bits of data, which allows 1.5 Mbps of data to be transmitted in 20 time slots per second. The line efficiency is 75%. The transmission volume is set to 1.5 Mbps with 20 time slots as a unit, taking its connection to the ISDN line exchange/ packet exchange service called "INS Net 1500" into account. That is, since "INS Net 1500" provides 24 channels whose transmission amount is 64 Kbps with a total transmission amount of about 1.5 Mbps, this embodiment is designed to match the "INS Net 1500."

Since the optical communication network shown in FIG. 7 has bidirectionality, the time division controller 10 generates a token permitting simultaneous transmission to two nodes in the case of one-to-one communication. For broadcasting, i.e., one-to-many communication, the time division controller 10 generates a token permitting transmission only to a single node. Confidentiality is provided for one-to-one communication; i.e., correct data is not transmitted to nodes other than the concerned communicating nodes as described in Unexamined Japanese Patent Publication No. Hei. 3-296332.

This embodiment has the aforesaid configuration with special considerations for connection to the "INS Net 1500" and DVI video signal transmission. If audio signals are to be transmitted, time slot design must be so changed that signal transmission by, e.g., every 64 Kbps can be implemented. DVI stands for Digital Video Interactive.

While there is only one signal transmission channel requiring realtime processing in the above embodiment, the number of such channels may be increased as necessary. Additionally provided channels may be controlled by the time division controller 10, or another time division controller may additionally be provided so that each transmission channel is controlled by its dedicated controller. The latter configuration is preferable from the network reliability viewpoint.

This embodiment has been described as a multi-media LAN. The LAN from the difference angle has the same function as the digital PBX (private branch exchange). In addition, the LAN can broadcast, an advantage that cannot be performed by the general digital PBX. Thus, it goes without saying that the use of the configuration of the invention as a digital PBX is included in the invention.

While the optical communication network multiplexes two wavelengths in the above embodiment, the degree of multiplexing can be increased. If the semiconductor laser amplifier is used as a link amplifier, the wavelength range with gain is from about 50 nm (−3 dB: 0.8 µm band) to about 80 nm (−3 dB: 1.3 µm band). Thus, multiplexing the wavelengths every 1 nm will implement amplification of about 50 to 80 channels with a single link amplifier.

While the LAN has been taken as an example in the above embodiment, the optical communication network of the invention, allowing some 50 independent channels to be configured, may also be applied to an extensive network such as an optical cable TV (CATV).

As described in the foregoing, the optical communication network of the invention can implement a plurality of transmission channels using a single optical fiber, and its expansion and reduction can be implemented easily. As a result, unlike a network configured by using a plurality of optical fiber cables, the consumption of the optical fiber cables and optical connectors is reduced, with advantages of smaller space and construction cost for the installation of the optical fiber.

Further, the LAN of the invention can implement a multi-media LAN permitting both data communication and audio and video signal transmission simultaneously by using a network configured by a single optical fiber.

In the above described optical communication networks, when an optical path is long in an optical communication network, optical amplifiers should be arranged along the path to compensate for attenuation of an optical signal.

Figure 14:
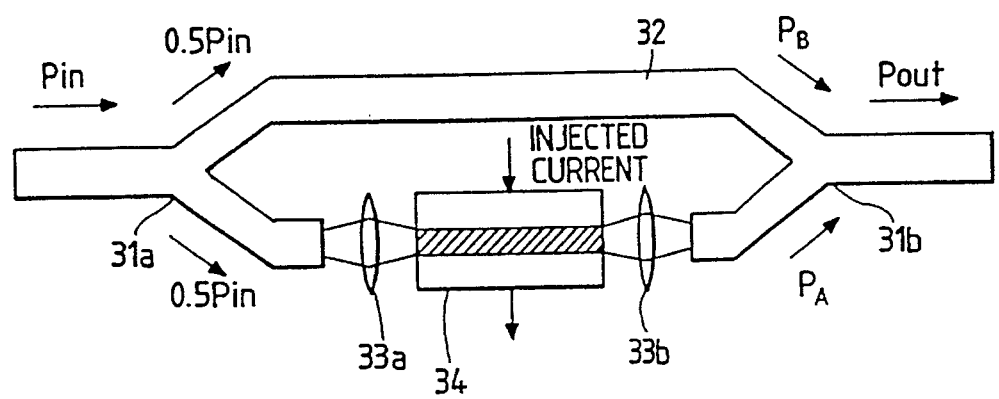
FIG. 14 is a schematic diagram showing an example of a configuration of an optical link amplifier.
Figure 15:
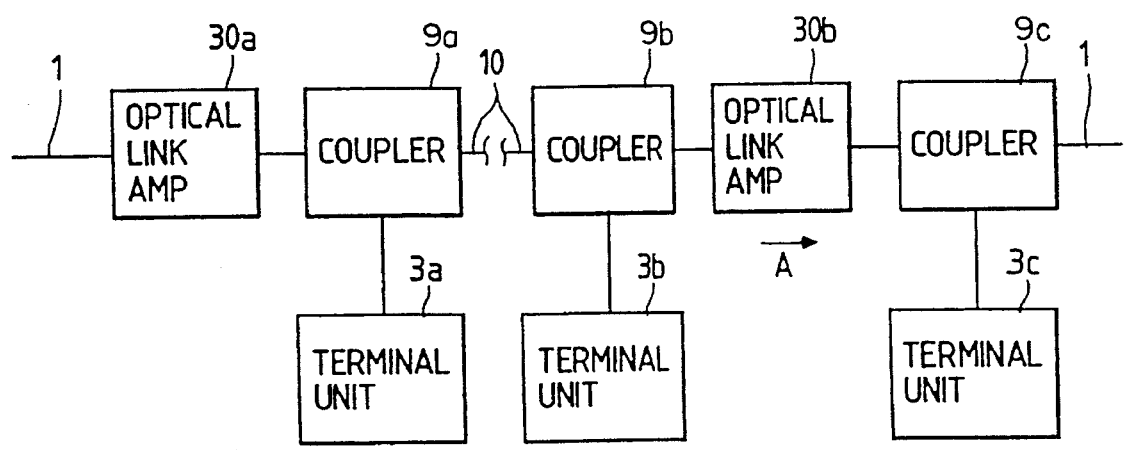
FIG. 15 is a block diagram showing an example of a configuration of an ordinary optical communication network using optical link amplifiers.

FIG. 14 is a schematic diagram showing an exemplary configuration of an optical link amplifier of the invention. An input signal beam is distributed into two equal beams by an optical distributing unit 31*a*, and one of the distributed input signal beams is supplied to a bypass optical waveguide 32, while the other beam is applied to a semiconductor laser amplifier 34 through a combined lens 33*a*. Since the semiconductor laser amplifier 34 is disclosed in publications such as "studies on semiconductor laser amplifiers used in optical communication systems" (Shimada and Nakagawa: o plus e, no. 117, August 1989, pp. 106–111), its detailed description will be omitted.

The beam amplified by the semiconductor laser amplifier 34 is applied to one of the input terminals of an optical synthesizing unit 31*b* through a combined lens 33*b*. The beam having passed through the bypass optical waveguide 32 is applied to the other input terminal of the optical synthesizing unit 31*b*. As a result, both beams are synthesized. The optical distributing unit 31a and the optical synthesizing unit 31b are identical in structure.

If the amplifier is thus constructed, the problem of interference of beams arising from the two different optical paths will have to betaken care of since the signal beam is generally a laser beam which is coherent. However, when the semiconductor laser amplifier is used, its large insertion loss causes few interference. The following will account for this in detail.

If it is assumed that the injected power of a signal beam is Pin, the signal beam is divided into two beams by the optical distributing unit 31a, each having an injected power of 0.5 Pin, and the beams are distributed to both the bypass optical waveguide 32 and the Semiconductor laser amplifier 34.

During normal operation, the semiconductor laser amplifier 34 keeps its internal gain exceeding its insertion loss. If the insertion loss is 10 dB and the internal gain is 23 dB, the effective gain becomes 13 dB. Therefore, the signal beam Pa having passed through the semiconductor laser amplifier 34 is amplified to a value 20 times as large as the input power, thus having a power of 10 pin. On the other hand, the signal beam $P_b$ having passed through the bypass optical waveguide 32 has only 0.5 Pin. A signal beam $P_{out}$ obtained by synthesizing both beams can be expressed as follows.

$$P_a - P_b \leq P_{out} \leq P_a + P_b \quad (1)$$

$$0.5\text{Pin} \leq P_{out} \leq 10.5 \text{ Pin} \quad (2)$$

In the above equations, "$p_a - p_b$" is obtained when both beams are in opposite phase to each other, while "$p_a + p_b$" is obtained when both beams are in phase.

Assuming that current injection to the semiconductor laser amplifier 4 is interrupted during an abnormal operation, $p_a$ becomes 0.05 Pin. Therefore, $P_{out}$ becomes as follows from equation (1).

$$-0.45 \text{ Pin} \leq P_{out} \leq 0.55 \text{ Pin} \quad (3)$$

As indicated above, $p_a > p_b$ during normal operation and $p_a < p_b$ during abnormal operation. Thus, the influence of interference can be neglected.

According to the above embodiment, the optical link amplifier serves as an amplifier with a gain of about 10 dB at the time of normal operation and as an attenuator with an insertion loss of about 3 dB at the time of malfunction. Thus, the signal beam can be transmitted to a subsequent stage with a power of −13 dB (1/20) with respect to the normal operation even at the time of abnormality. This much attenuation is within the input dynamic range of a terminal unit, thus allowing the signal beam to be received normally by the subsequent terminal unit. That is, a fail-safe function can be implemented in the optical communication network.

While the case where the distribution ratio of the optical distributing unit 31a to the optical synthesizing unit 31b is 1:1 has been described, the distribution ratio of the invention is not limited thereto; other distribution ratios may, of course, be applied.

Figure 16:
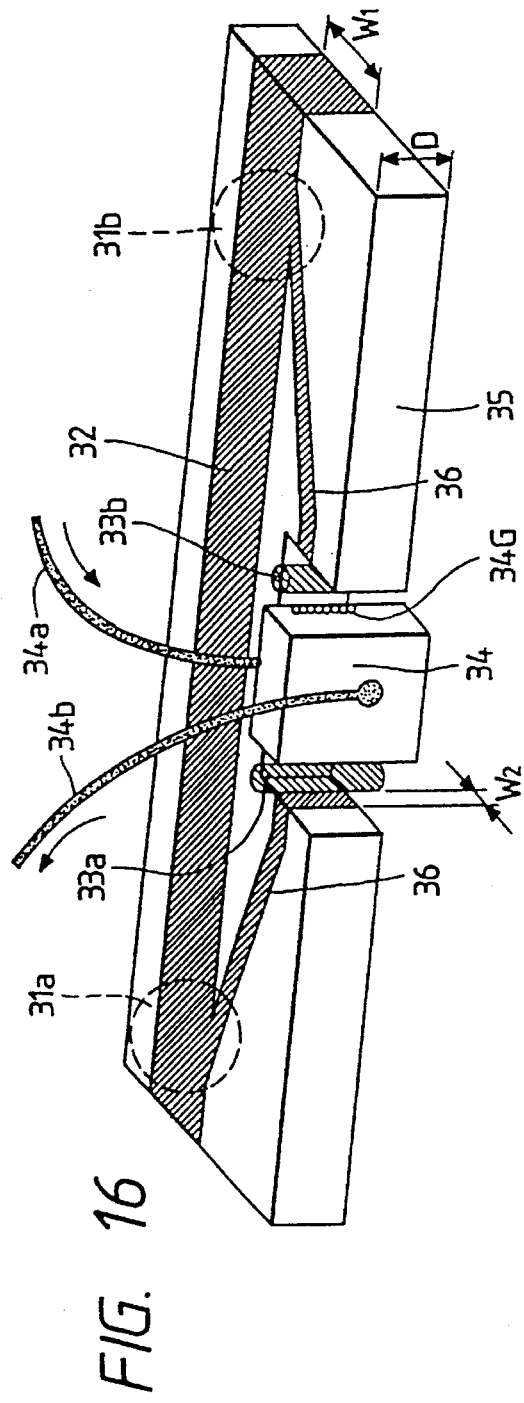
FIG. 16 is a perspective view illustrating an embodiment of the optical link amplifier, in which another distribution ratio is adopted.

FIG. 16 is a schematic diagram showing an embodiment in which another distribution ratio is adopted. This embodiment is an example in which the invention is applied to a multimode fiber.

In the embodiment shown in FIG. 16, optical distributing/synthesizing units 31a, 31b and a bypass 32 are formed on a polycarbonate substrate 35 by a selective polymerization method. The distribution ratio is varied by the width of an optical waveguide. More specifically, the width of an optical waveguide 36 to be branched into a semiconductor laser amplifier 34 is designed to be narrower than the width of the bypass 32.

The thickness D of the polycarbonate substrate 35 is set to 42 μm, the width $w_1$ of the optical waveguide is set to 42 μm, and the width $w_2$ of the optical waveguide 36 branched into the semiconductor laser 34 side is set to 4 μm. The method of forming the optical waveguide is known; e.g., see Takato and Kurokawa, "Method of Preparing Optical Waveguides with High Molecular Materials," o plus e, November 1984, pp. 78–83. Although the width $w_2$ of the optical waveguide 36 is small compared to the thickness d of the substrate 35, such an optical waveguide as having a high aspect ratio can be formed by optical selective polymerization of polycarbonate with methyl acrylate. Current is injected into the semiconductor laser amplifier 34 through electrodes 34a, 34b. The direction in which the current is injected coincides with the direction of smaller dimension ($w_2$) of the optical waveguide 36. The optical waveguide 36 and the semiconductor laser amplifier 34 are coupled through coupling lenses 33a, 33b. Each of the coupling lenses 33a, 33b is a cylindrical lens and is arranged so as to converge light in the direction of smaller dimension.

A gain region 34G at which the semiconductor laser amplifier has a gain can be formed so that its width is relatively large; e.g., 100 μm in a direction vertical to the direction of current injection. In contrast, the width in the current injection direction can be set only to about 2 to 3 μm. Therefore, even if the width $w_2$ shown in FIG. 16 is set to 20 μm, an input light beam to the semiconductor laser amplifier is not so different from that in the case where the width $w_2$ is set to 4 μm, indicating that a larger width $w_2$ is not advantageous. To overcome this problem, this embodiment has designed the sectional structure of the optical waveguide 36 in accordance with the thickness and width of the gain region of the semiconductor laser amplifier so that the coupling efficiency can be improved.

Since the gain of the semiconductor laser amplifier 34 is 30 dB, the insertion loss (distribution ratio) of the optical distributing/synthesizing units 31a, 31b is −10 dB, and the coupling loss between the semiconductor laser amplifier 34 and the optical waveguide 36 is about −3 dB, the net gain is 17 dB. In this embodiment, even if the semiconductor laser amplifier 34 fails, the majority of an optical signal is transmitted through the bypass 32, thus ensuring a satisfactory fail safe performance compared to the case where the distribution ratio is 1:1.

Figure 17:
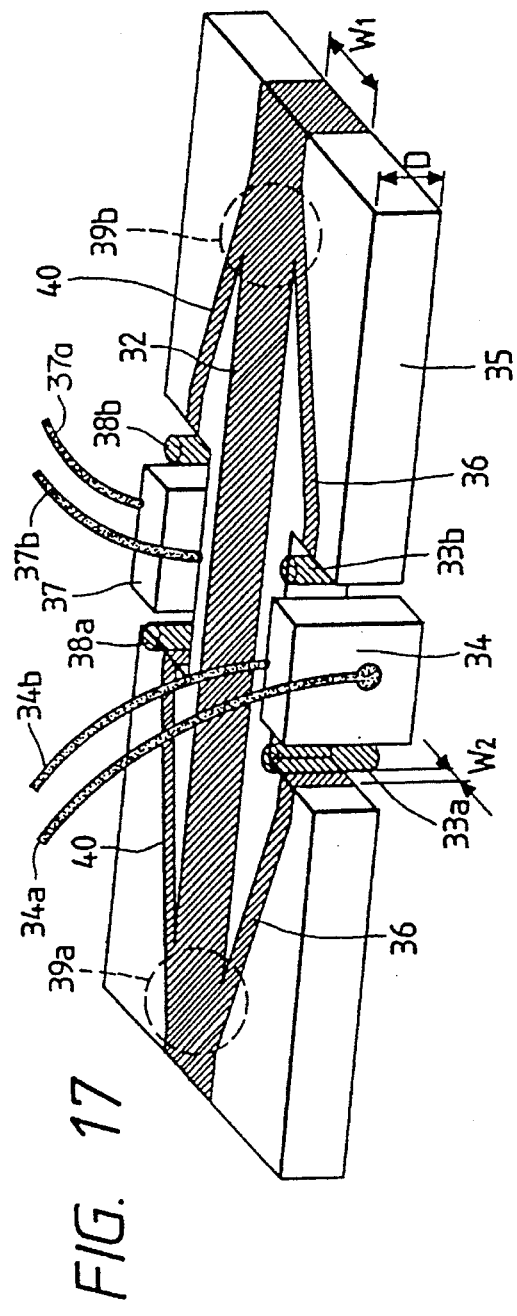
FIG. 17 is also a perspective view illustrating modification of the embodiment shown in FIG. 16.
Figure 18:
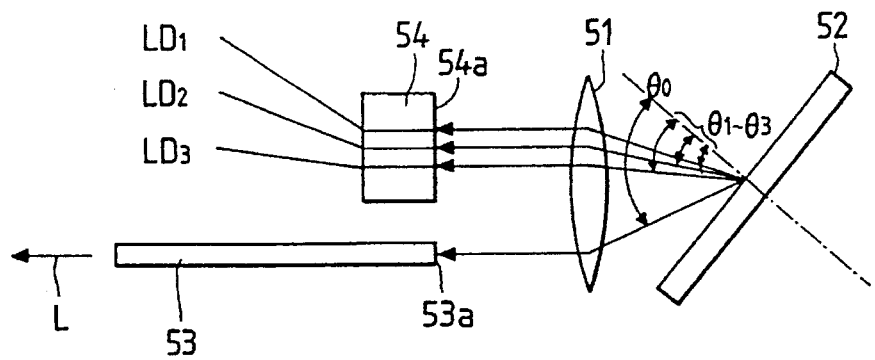
FIG. 18 is a schematic diagram showing a conventional art.
Figure 19:
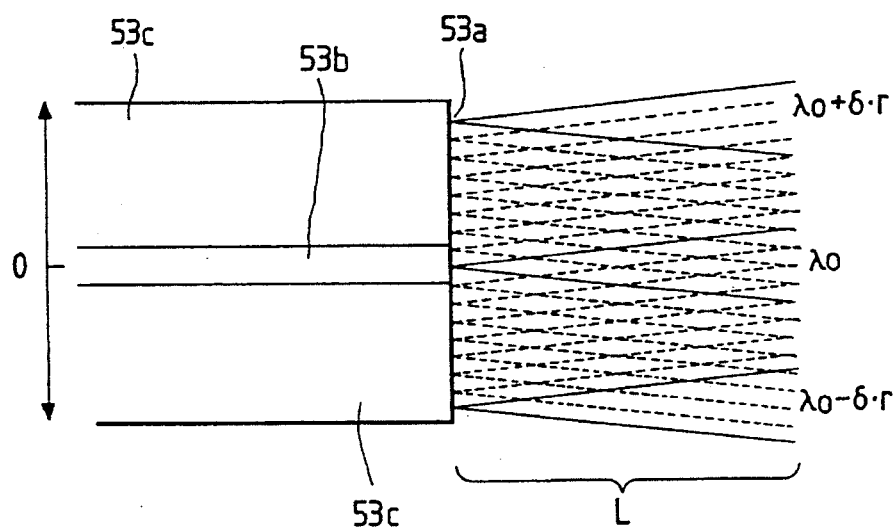
FIG. 19 is a schematic diagram showing that a light emitting spectrum expands and that the coupling with an optical fiber is decreased in the conventional art.
Figure 20A:
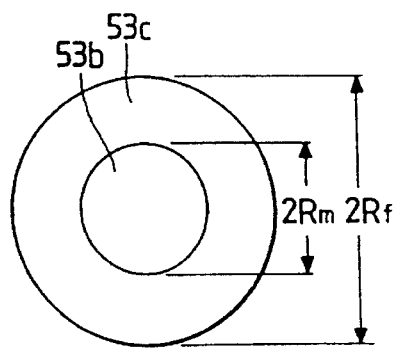
FIG. 20(a) is a diagram showing a sectional view of a multimode fiber.
Figure 20B:
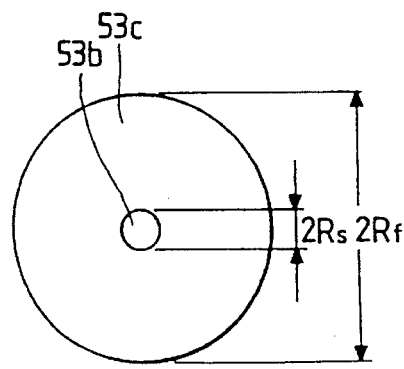
FIG. 20(b) is a diagram showing a sectional view of a single mode fiber.
Figure 21:
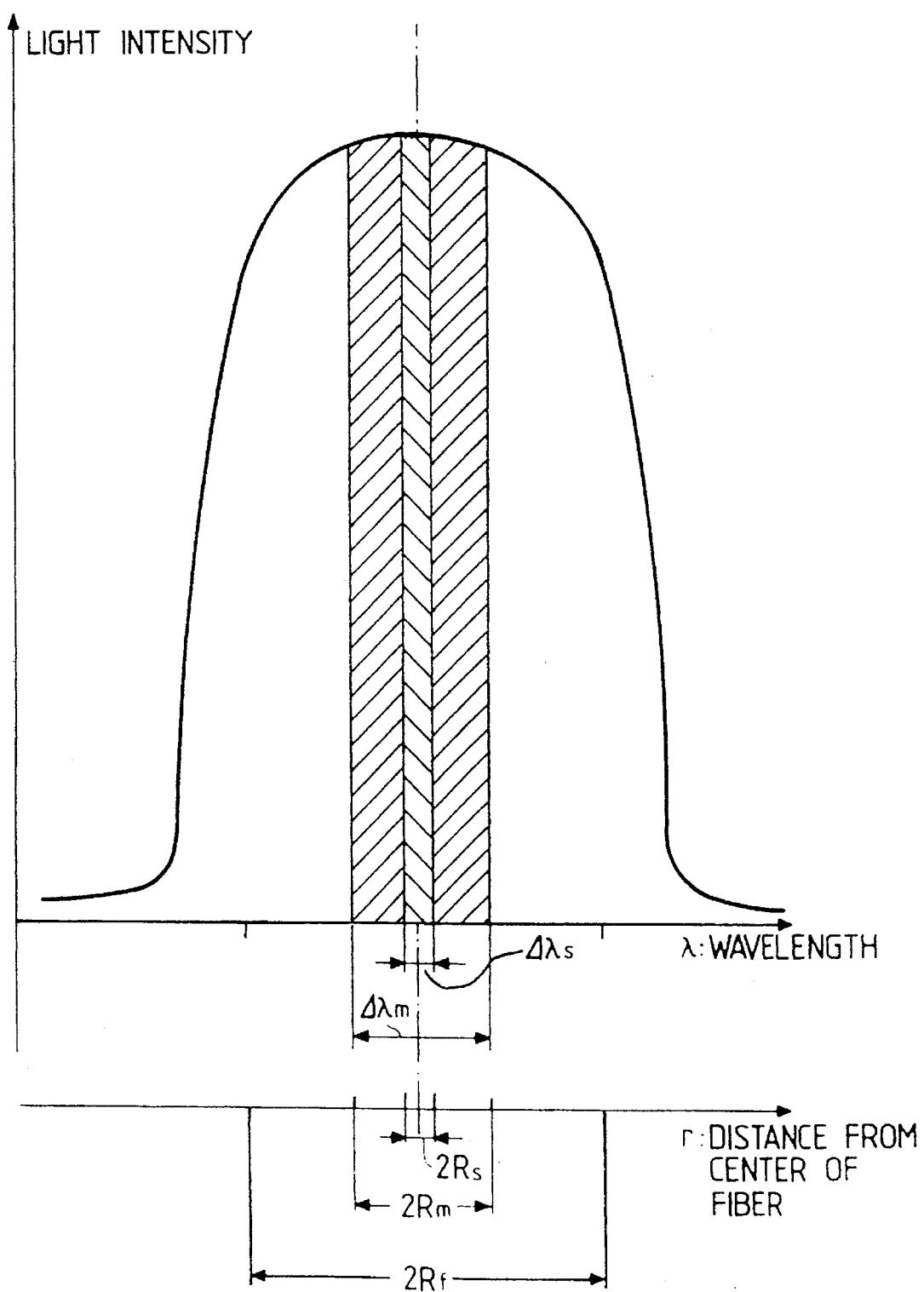
FIG. 21 is a schematic diagram showing a light emitting spectrum in the conventional art.

FIG. 17 shows an embodiment in which the embodiment shown in FIG. 16 is modified. In the embodiment shown in FIG. 17, trifurcating optical distributing/synthesizing units 39a, 39b are arranged in place of the bifurcating optical distributing/synthesizing units 31a, 31b shown in FIG. 16. Further, in addition to the semiconductor laser amplifier 34, a semiconductor laser amplifier 37 is provided. This semiconductor laser amplifier 37 is similarly coupled to an optical waveguide 40 through coupling lenses 38a, 38b as in the embodiment shown in FIG. 16. Further, electrodes 37a, 37b are drawn from the semiconductor laser amplifier 37.

In this embodiment there is no such occasion as to operate the two semiconductor laser amplifiers 34 and 37 simultaneously. In other words, a voltage is applied either across the electrodes 34a, 34b or across the electrodes 37a, 37b. It is the semiconductor laser amplifier 34 that is normally operated, and when the first semiconductor laser amplifier 34 does not function for a certain reason, the second semiconductor laser 37 is put in operation. That is, the semiconductor laser amplifier 37 is a backup for the semiconductor laser amplifier 34.

While the optical link amplifier implemented by the semiconductor laser amplifier(s) have been described in the above embodiments, the application of the invention is not limited thereto. The invention can be applied to any type of optical link amplifier, as long as it employs an optical amplifier whose insertion loss is large.

A modification of the arrangement of FIG. 17 is that the semiconductor laser amplifiers 34 and 37 have different wavelength bands which are operable for amplifying the input signals. This arrangement can be realized by varying the band gaps of the active layer materials of those amplifiers 34 and 37. For example, the band gap can be varied by the composition ratio $\underline{x}$ of an $AL_xGa_{1-x}As$ as the typical active layer material of each of the amplifiers 34 and 37 (e.g., x=0 for the amplifier 34, and x=0.1 for the amplifier 37). It can also be realized in a manner that a quantum well structure is employed for the active layer, and the width of the well is varied. As it is known, when the quantum well width gets narrowed, the quantum confining effect widens the effective band gap of the active layer. Additionally, it can be realized by changing the active layer material to different materials, e.g., an AlGaAs alloy and an GaInAsP alloy. In this modification, the semiconductor laser amplifiers 34 and 37 operate in different wavelength bands. Accordingly, the Wavelength bands allowing the amplifying operation of the amplifiers are broadened. Additionally, this modification can keep the following beneficial effects as they are; the fail-safe function created by the fact that the bypass circuit is used commonly by both the amplifiers, and the improvement of the coupling efficiency by making the semiconductor laser amplifier and the optical waveguide to match in cross section shape.

Further, it goes without saying that none of the embodiments shown in FIGS. 14, 16 and 17 are limited to directional optical amplification, but that they can be used as bidirectional optical amplifiers as well.

As described in the foregoing, according to the invention, an optical signal can be transmitted through the optical amplifier to some extent in the event of trouble at the optical amplifier since an optical waveguide is arranged as a bypass in parallel to such an Optical amplifier whose insertion loss is large as a semiconductor laser amplifier. Therefore, even if the optical amplifier fails, the damage that a communication network undergoes can be reduced.

Next, an example of a wavelength multiplex laser oscillator which acts as a light source in the optical communication network will be described. The laser oscillator is designed to narrow the spectral bandwidth of a laser beam and improve the coupling efficiency with an optical fiber.

Figure 22:
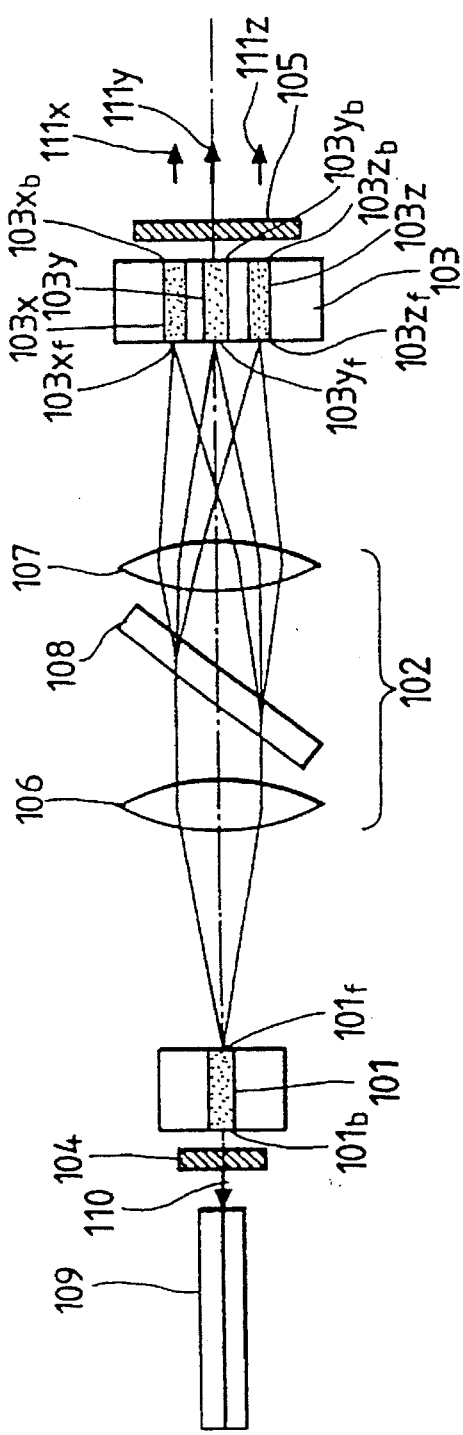
FIG. 22 is a schematic diagram showing an exemplary configuration of the invention.

FIG. 22 shows a schematic configuration of the first aspect of the invention. One entrance/exit port $101_f$ of an optical waveguide 101 is in an optically conjugate relation with one entrance/exit port group $103x_f$ to $103z_f$ of laser amplifiers 103x to 103z of a laser amplifier array 103 with respect to an image formable polychrometer system 102. A light reflecting means 104 is provided on the other entrance/exit port $101_b$ side of the optical waveguide 101; and a light reflecting means 105, on the other entrance/exit port group $103x_b$ to $103z_b$ side of the laser amplifier array 103. The laser amplifier array 103 may be formed of any type of laser amplifiers including semiconductor laser amplifiers. While there are 3 laser amplifiers employed in FIG. 22, the number of laser amplifiers is arbitrarily selectable. Although the polychrometer system 102 is made up of a lens 106, a diffraction grating 108, and a lens 107 in FIG. 22, a prism may be used in lieu of the diffraction grating. Or, a concave diffraction grating, an unequally distant grating, or the like may instead be used. The light reflecting means 104 and 105 are usual mirrors, Bragg's reflector or the like.

A light beam injected from the entrance/exit port $101f$ of the optical waveguide 101 forms an image at the entrance/exit port group $103x_f$ to $103z_f$ via the polychrometer system 102. At this point light beams having wavelengths corresponding to the laser amplifiers 103x to 103z form images at the entrance/exit port group $103x_f$ to $103z_f$, respectively. The light beams amplified at the respective laser amplifiers 103x to 103z are reflected by the light reflecting means 105 and return to the laser amplifiers 103x to 103z. Thereafter, the light beams are injected onto the entrance/exit port $101_f$ of the optical waveguide 101 by following the same route in the opposite direction. The light beam passes along the optical waveguide 101, is reflected by the light reflecting means 104, and returns to the optical waveguide 101. Thus, a laser oscillation corresponding to the combination of the optical waveguide 101 and the laser amplifiers 103x to 103z occurs. When the exciting condition of the laser amplifiers of the laser amplifier array 103 is changed, the optical signals having wavelengths corresponding to the respective laser amplifiers of the laser amplifier array 103 can be modulated independently. For example, an optical signal can be modulated by modulating drive current for a semiconductor laser.

While there are three laser amplifiers used in FIG. 22, a laser amplifier array 103 consisting of n (n being an integer) laser amplifiers can start laser oscillation having n wavelengths. In addition, not only n wavelengths are switched to oscillate a laser, but also laser oscillations with a plurality of wavelengths can be obtained simultaneously.

In this embodiment, the end surface of an optical fiber is not used as a reflecting surface for laser oscillation, but the laser beams are injected into the optical fiber through the optical waveguide 101 and the light reflecting means 104. Since the optical waveguide 101 is not subjected to dimensional restrictions such as standards imposed on optical fibers, the diameter of the optical waveguide 101 can be decreased to such an extent as the fabrication capacity permits. Therefore, the oscillation spectrum of a laser beam can be narrowed than in the conventional art discussed in the above-mentioned Unexamined Japanese Patent Publication No. Sho. 62-229891.

Further, with respect to coupling with an optical fiber, the problem that only a part of a laser beam is introduced into the optical fiber as in the conventional art disclosed in the above-mentioned publication does not exist with this configuration. The reason is that it is only the laser beam corresponding to the optical path passing through the optical waveguide 101 that oscillates.

Figure 23:
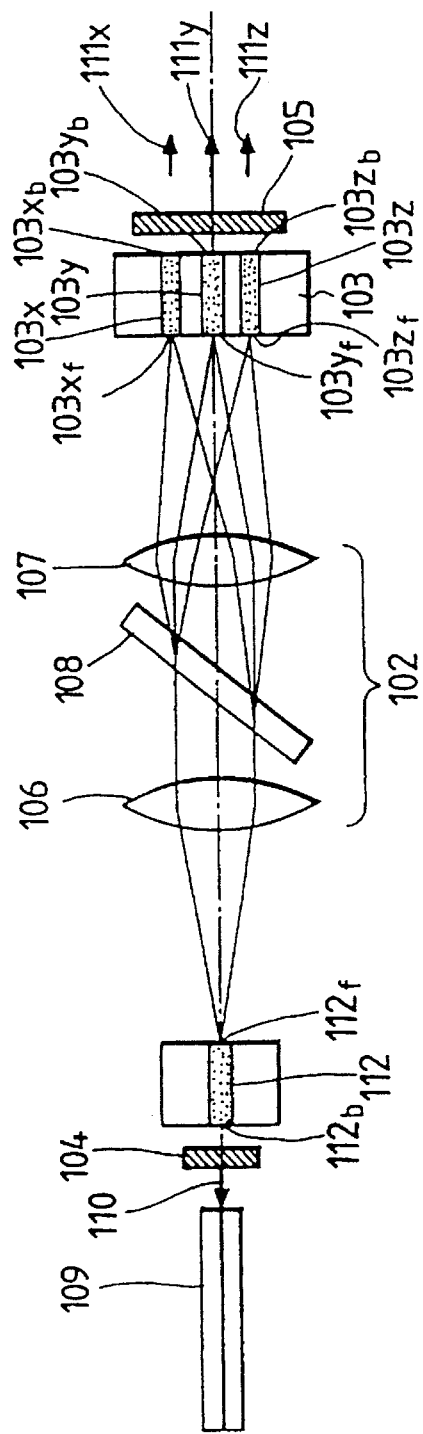
FIG. 23 is a schematic diagram showing another exemplary configuration of the invention.

The second aspect Of the invention is, as shown in FIG. 23, has a configuration in which the optical waveguide 1 shown in FIG. 22 is replaced with a laser amplifier 112. The laser amplifier 112 is being excited at all times, and by modulating the exciting condition of the laser amplifiers of the laser amplifier array 103, then optical signals having wavelengths corresponding to the respective laser amplifiers of the laser amplifier array 103 can be modulated independently. Reference characters $112_f$, $112_b$ designate entrance/exit ports of the laser amplifier 112.

The reflecting means 104 arranged so as to partially transmit light, and a laser beam 110 extracted through this reflecting means 104 is guided to an optical fiber 109. Accordingly, wavelength multiplex optical signals can be sent to the optical fiber 109 with no provision of separate optical synthesizing means.

The reflecting means 105 that is provided on the side of the entrance/exit port group $103x_b$ to $103z_b$ of the laser amplifier array 103 may be arranged so as to partially transmit light. With such an arrangement, optical signals 111x to 111z, each having a different wavelength, can be extracted individually, thus allowing optical signals to be monitored individually. Accordingly, the levels of output light beams can be subjected to negative feedback.

Embodiments of a wavelength multiplex laser oscillator according to the invention will be described with reference to the drawings.

FIG. 24a and 24B are schematic diagrams showing a first embodiment of a wavelength multiplex laser oscillator of the invention. One end surface 114 of a semiconductor laser amplifier array 113 is provided with a anti-reflective coating, while on the other end surface 115 is left as cleaved or is provided with a highly reflective coating to have a predetermined index of reflection (35 to 80%). Light beams projected from the end surface 114 side of the semiconductor laser amplifiers 116x, 116y, 116z are injected from the end surface 114 side into a semiconductor laser amplifier 117 by a polychrometer system consisting of a lens 118 and a diffraction grating 119. The light beams amplified within the semiconductor laser amplifier 117 are reflected on the end surface 115 and return to the semiconductor laser amplifiers 116x, 116y, 116z following the path in the reverse direction. As shown inside a circle depicted by a dotted line in an enlarged manner, the reflecting surface of the diffraction grating 119 is provided with a saw-toothed grating 124 so that such a diffracting condition as $d \cdot \sin \theta \lambda n$ can be satisfied. The light beams amplified within the semiconductor laser amplifiers 116x, 116y, 116z are also reflected by the end surface 115. Thus, the light beams bounces back and forth, thus initiating laser oscillation with a beam generated by spontaneous emission, etc., as a species. Part of the laser beam obtained by the laser oscillation passes through the end surface 115 of the semiconductor laser amplifier 117 to be supplied to the optical fiber 109. A part of the laser beam also passes through the end surfaces 115 of the semiconductor laser amplifiers 116x, 116y, 116z to be supplied to a light receiving array 120 having light receiving units 120x, 120y, 120z so as to correspond to the semiconductor laser amplifiers 116x, 116y, 116z, respectively. Therefore, the oscillated laser beams can be monitored every wavelength. By controlling currents to be supplied to the semiconductor laser amplifiers 116x, 116y, 116z in accordance with the monitored levels, laser beam outputs can be maintained constant.

Figure 26:
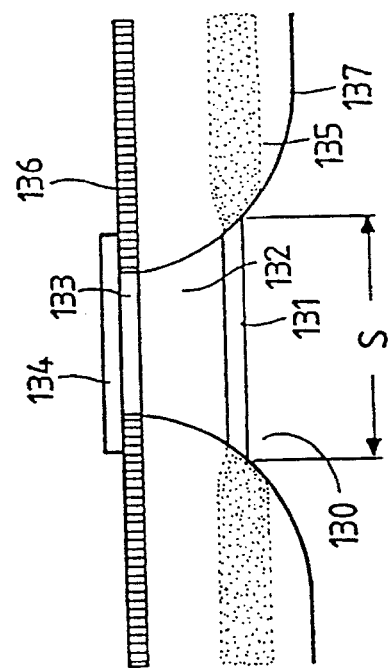
FIG. 26 is an enlarged diagram showing a main portion of the sectional view shown in FIG. 25.

A sectional view of the semiconductor laser amplifier array 113 taken along a line Y—Y shown in FIG. 24A is shown in FIG. 25, and the semiconductor laser amplifier 116x is shown in FIG. 26 in an enlarged manner. Each of the semiconductor laser amplifiers 116x, 116y, 116z, 117 is identical in structure. Each semiconductor laser amplifier has a double heterstructure in which a GaAs active layer 131 is interposed between an n-AlGaAs clad layer 130 and a p-AlGaAs clad layer 132. Light is confined in the horizontal direction by utilizing the IID (Impurity Induced Disordering). This is a phenomenon in which diffusion of an impurity such as silicon will crystallize both AlGaAs of the clad layer and GaAs of the active layer in a mixed manner. In FIG. 26, a disordered crystal region 135 is formed at a region through which the diffusion front 137 of the silicon has passed. Since the disordered crystal region 135 has a lower index of refraction than the active layer 131, the portion having no mixed crystal is formed into the semiconductor laser amplifiers 116x, 116y, 116z, 117. Therefore, the semiconductor laser amplifiers 116x, 116y, 116z, 117 serve also as optical waveguides. Reference numeral 136 designates an insulated region formed by proton bombardment.

The semiconductor laser amplifier array 113 shown in FIGS. 25 and 26 is of a structure having a plurality of semiconductor laser amplifiers on a single substrate. The substrate is a silicon-doped GaAs substrate. Both the n-type clad layer 130 and the p-type clad layer 132 of a semiconductor laser element are composed of $Al_{0.4}Ga_{0.6}As$ having a thickness of 1.0 μm; the active layer 131 is composed of $Al_{0.1}Ga_{0.9}As$ with a thickness of 0.1 μm. The clad layer 130 on the substrate side is doped with Se to form an n-type region with a carrier concentration of $1.0 \times 10^{18}$ cm$^{-3}$. The clad layer 132 on the upper side is doped with Mg to form a p-type region with a carrier concentration of $1.0 \times 10^{18}$ cm$^{-3}$. The active layer 131 is sandwiched between these two clad layers. On an upper portion of the p-type clad layer 132 on the upper side is a cap layer 133 to form an ohmic contact. The cap layer 133 is made of a GaAs region doped with Mg with a thickness of 0.1 μm. The cap layer 133 has a carrier concentration of $1.0 \times 10^{18}$ cm$^{-3}$. Reference numeral 134 designates an electrode.

An exemplary design of a semiconductor laser amplifier is described below. The stripe width S of the semiconductor laser amplifier is set to 2 μm; the pitch P among semiconductor laser amplifiers 116x, 116y, 116z is set to 20 μm; and the distance D between the semiconductor laser amplifiers 116y and 117 is set to 3.44 mm (see FIGS. 25 and 26). Also, the dimensions of the semiconductor laser amplifier array are: L=5.0 mm and W=0.25 mm in FIG. 24. The focal length $F_0$ of the lens 118 is 20 mm; the diffraction grating 19 has 100 lines/mm with its blaze wavelength set to 900 nm. Therefore, the distance d between lines of the diffraction grating is set to 10 μm and the blaze angle θ to 2.9°, Under the above design conditions, laser oscillations are initiated at wavelengths 850 nm, 860 nm, and 870 nm that correspond to the semiconductor laser amplifiers 116x, 116y, 116z, respectively.

Figure 27B:
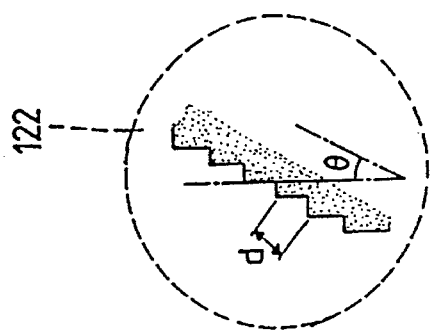
FIGS. 27A and 27B are schematic diagrams showing a second embodiment of a wavelength multiplex laser oscillator of the invention.
Figure 27A:
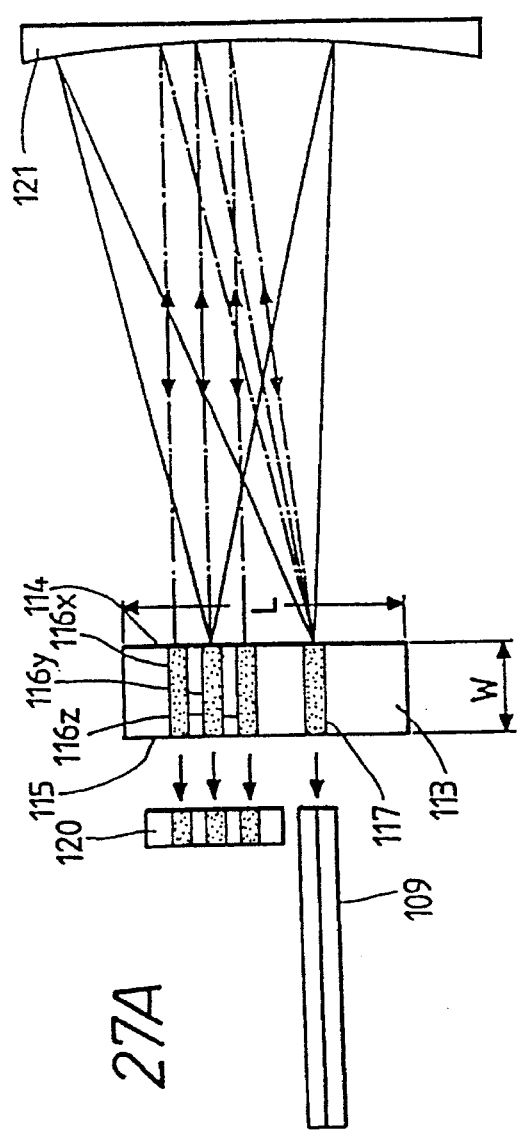

A second embodiment of the wavelength multiplex laser oscillator of the invention is shown in FIGS. 27. In this embodiment the lens 118 and the diffraction grating 119 of the first embodiment are replaced with a concave diffraction grating 121. A saw-toothed grating 122 is provided on the reflecting surface of the concave diffraction grating 121 as shown in a circle depicted by a dotted line in an enlarged manner so that such a diffracting condition as $d \cdot \sin \theta = n\lambda$ can be satisfied. Since this concave diffraction grating 21 serves both as a diffraction grating and a concave reflecting mirror, it can perform the same function as the first embodiment shown in FIG. 24 with such a configuration.

Figure 28B:
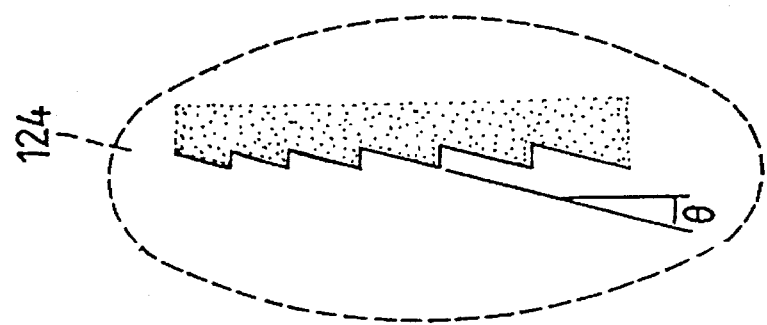
FIGS. 28A and 28B are schematic diagrams showing a third embodiment of a wavelength multiplex laser oscillator of the present invention.
Figure 28A:
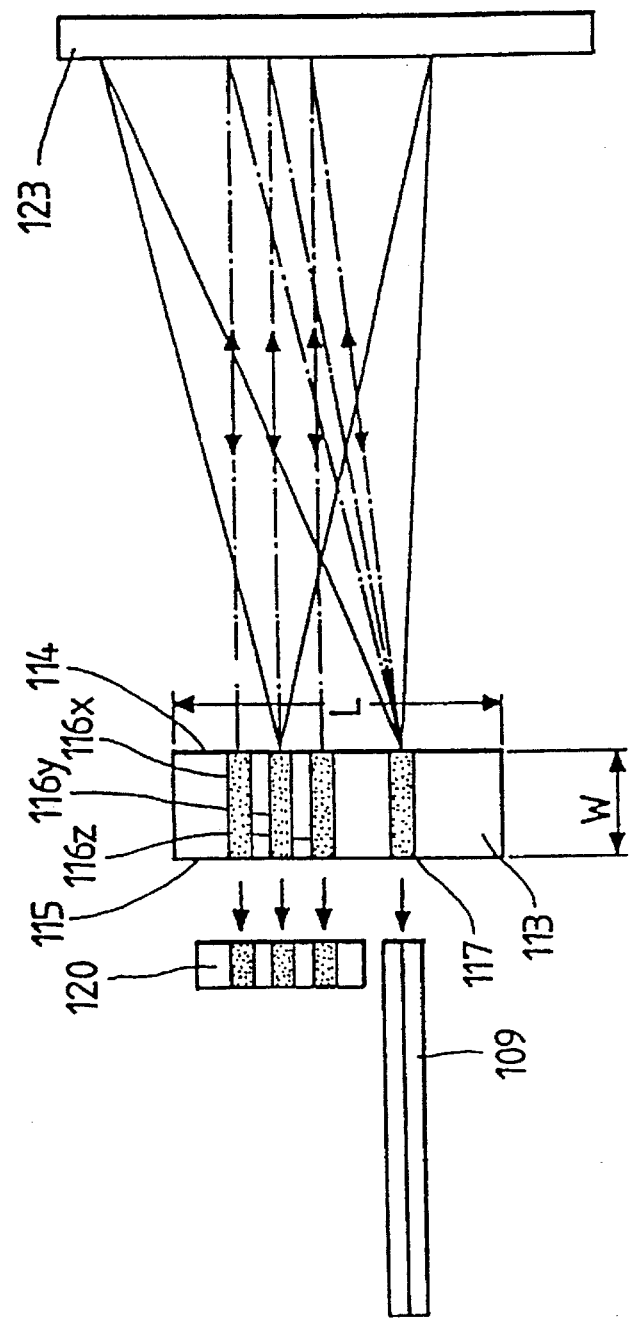

A third embodiment thereof is shown in FIG. 28A and 28B. In this embodiment, the lens 118 and the diffraction grating 119 of the first embodiment are replaced with an unequally distant grating 123 called a "Chirp grating." A saw-toothed grating 124 is formed on the reflecting surface of the unequally distant grating 123 as shown in a circle depicted by a dotted line in an enlarged manner, the saw-toothed grating extending so that its pitch is sequentially increased from the center toward the periphery. Since this unequally distant grating 123 serves both as a diffraction grating and a concave reflecting mirror, it can perform the same function as the first embodiment shown in FIGS. 24 with such a configuration.

A fourth embodiment of the invention is shown in FIGS 29A and 29B. In this embodiment the configuration of the second embodiment is formed into an optical integrated circuit. In the fourth embodiment, four semiconductor laser amplifiers 116x, 116y, 116z, 117 as well as a concave diffraction grating 125 with a radius R are formed on a common substrate made of GaAs. As shown in FIGS. 29A and 29B, the center and size of the radius are selected so that laser beams from the semiconductor laser amplifiers 116x, 116y, 116z can be injected commonly into the semiconductor laser amplifier 17. Each of the semiconductor laser amplifiers 116x, 116y, 116z has the same structure as that of the first embodiment shown in FIGS. 24 to 26.

A sectional view of the fourth embodiment of the invention taken along a line X—X in FIG. 29A is shown in FIG. 30. Since the index of refraction of the disordered crystal region 135 is lower than that of the active layer 131 but higher than those of the clad layers 132, 130 interposing it therebetween, light is confined in the direction vertical to the substrate, thus functioning as a so-called slab waveguide. Further, the difference in the index of refraction between the active layer 131 and the disordered crystal region 135 is in the order of several percents, which makes the index of reflection at an interface 138 sufficiently small.

The concave diffraction grating 125 shown in FIG. 29A can be formed by dry etching. That is, a vertical end surface having a saw-toothed grating 126 (see FIG. 29) is formed on an end portion of a substrate 127 as shown in FIG. 30, and a laser beam is reflected by causing this vertical end surface to act as a mirror. A technique for forming an end face mirror extending vertically with respect to the substrate by dry etching is disclosed, e.g., in Asakawa et al., "Dry Etching of III-V Semiconductors," Oyo Butsuri, Vol. 54, No. 11, (1985), pp. 1136–1153, and such a technique may be used.

In the fourth embodiment shown in FIGS. 29, since the slab waveguide has a propagation loss of about 10 to 15 dB/cm, the optical path length along the slab waveguide is confined within 1 cm or so with R=3.5 mm. Further, the distance d between lines of the diffraction grating is set to 2 μm (equivalent to 500 lines/mm), with its blaze angle θ correspondingly set to 4.1°. The pitch P among the semiconductor layer amplifiers 116x, 116y, 116z is set to 10 μm, a half the pitch of the first embodiment shown in FIG. 24. The stripe width S is set to 2 μm, the same as that of the first embodiment. The above design parameters have been selected considering that the index of refraction of AlGaAs is about 3.5. Since the refractive index is comparatively larger than that of the atmosphere, the grating constant of the diffraction grating must accordingly be small. With the above design conditions, laser oscillations having wavelengths of 850 nm, 860 nm, 870 nm are initiated so as to correspond to the semiconductor laser amplifiers 116x, 116y, 116z. The distance D between the semiconductor laser amplifiers 116y and 117 is set to 1.72 mm.

A fifth embodiment of the invention is shown in FIG. 31B. This is an embodiment in which the third embodiment shown in FIG. 28 is formed into an optical integrated circuit. Although it is not basically different from the fourth embodiment shown in FIG. 29, it is distinguished from the fourth embodiment in that an unequally distant grating 28 is used instead of the concave diffraction grating 125. The unequally distant grating 128 can be obtained by forming a vertical end surface having a saw-toothed grating 129 by dry etching as in the fourth embodiment.

Figure 32:
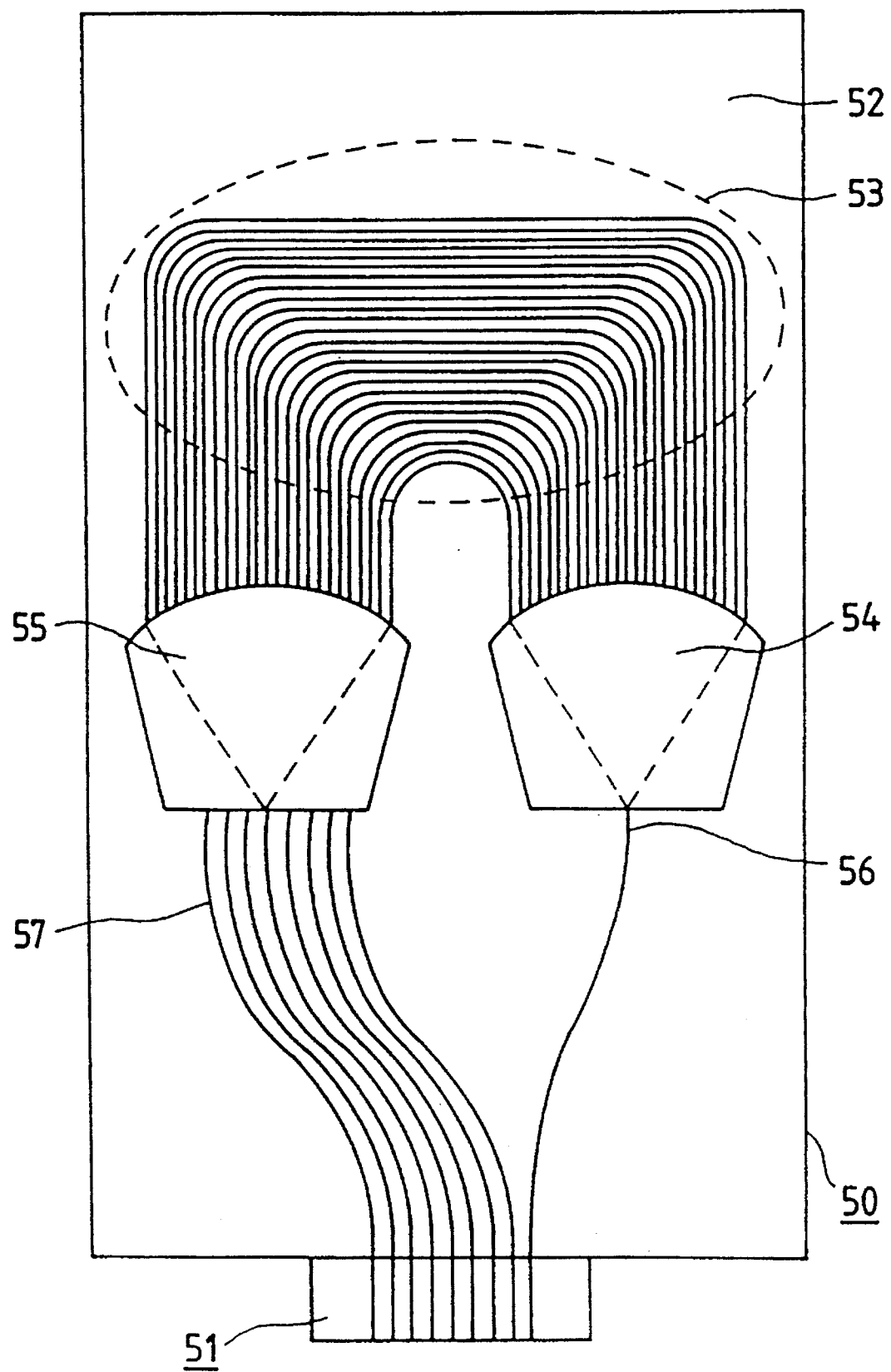
FIG. 32 is a plan view showing a sixth embodiment of a wavelength multiplex laser oscillator of the present invention.

The sixth embodiment of the present invention is shown in FIG. 32. In the sixth embodiment, an arrayed waveguide diffraction grating is used for the spectral optical system that can form an image. The arrayed waveguide diffraction grating is the combination of a semiconductor array 51 and an arrayed waveguide diffraction grating 50. The arrayed waveguide diffraction grating 50 includes a portion 53 where waveguides are arrayed on a substrate 52. The optical path differences among those waveguides are used for dispersing the light into a spectrum. Fan Shaped slab waveguides 54 and 55 are capable of forming images, and form a spectral optical system that can form an image. The arrayed waveguide diffraction grating is as described by Takahashi, Suzuki, and Nishi in their paper "Optical Multiplexer/Demultiplexer Using the Arrayed Waveguide Diffraction Grating", The 1992 IEICE autumn conference, C-200 (1991). In the case of the arrayed waveguide diffraction grating, the optical path differences among the waveguides may be set large. Accordingly, a large wavelength dispersion can be obtained so that the wavelength dispersive power of the arrayed waveguide diffraction grating may be set higher than the normal diffraction grating. The semiconductor laser elements of the semiconductor array 51 are coupled with the slab waveguides 54 and 55 through optical waveguides 56 and 57, respectively. The interface between the semiconductor array 51 and the arrayed waveguide diffraction grating 50 is designed so as to not cause reflection of light. The end face of the semiconductor array 51, which faces the arrayed waveguide diffraction grating 50 is coated with a ¼ wavelength film of refractive index n3, which satisfies $(n3)^2=(n1)^2 \times (n1)^2$. The semiconductor array 51 with Such an end face is brought into contact with the semiconductor array 51, with an optical grease intervening therebetween. In the above equation, n1 indicates a refractive index of the material of the semiconductor laser array, and n2 indicates a refractive index of the material of the arrayed waveguide diffraction grating 50.

Figure 33:
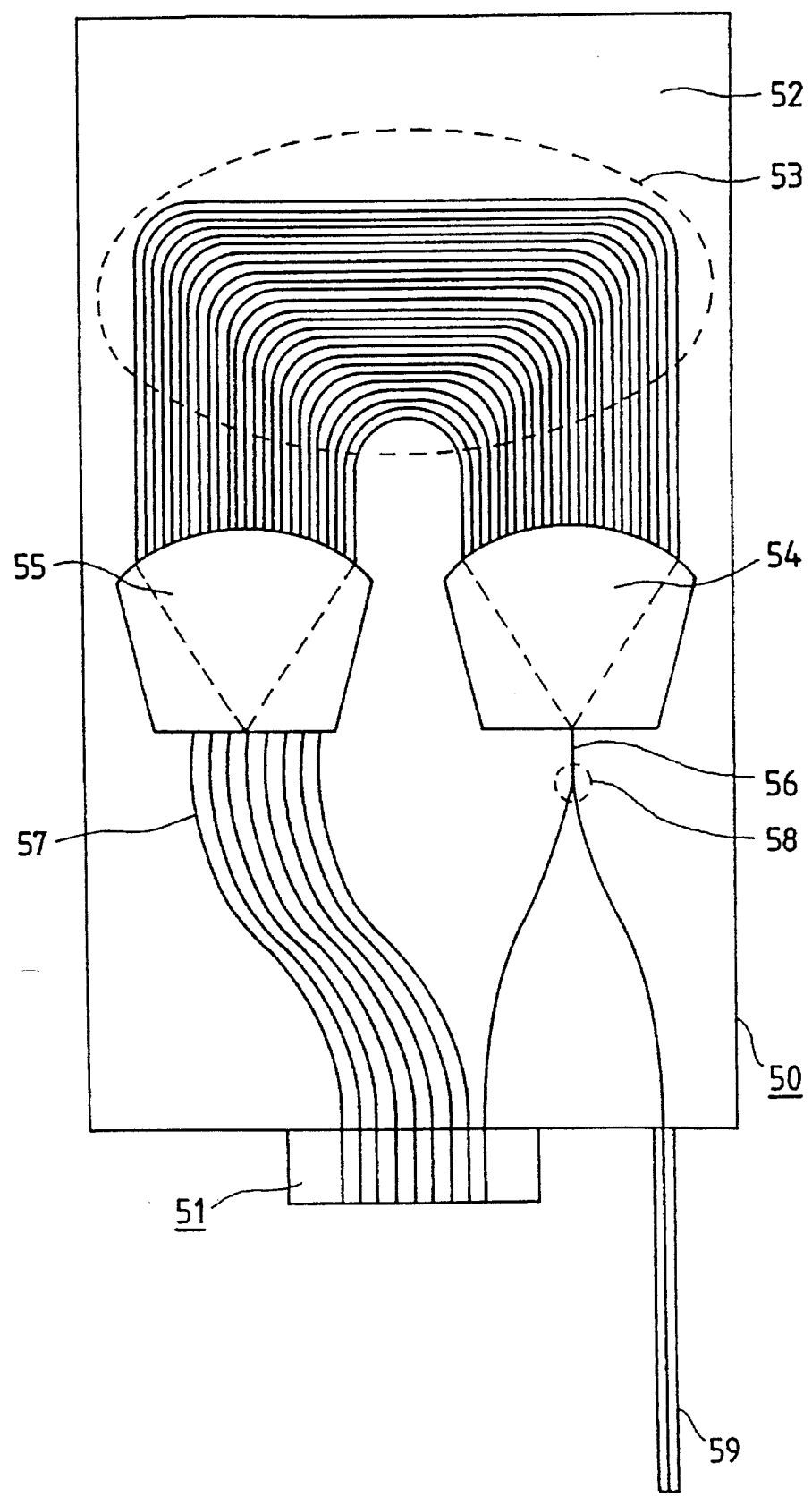
FIG. 33 is a plan view showing a modification of a sixth embodiment of a wavelength multiplex laser oscillator of the present invention as shown in FIG. 32.

FIG. 33 illustrates a modification of the embodiment of FIG. 32. In the modification, an optical coupler 58 is formed in an optical waveguide 56. The semiconductor laser amplifier array 51 is coupled with an output fiber 59 by way of the optical coupler 58. The arrangement of this modification is simpler than the arrangement in which the output fiber 59 is coupled with the side of the semiconductor laser amplifier array 51 where it does not contact with the optical integrated circuit board 52.

The semiconductor amplifier of which the diffraction grating is the chirp grating shown in FIG. 28 may be more easily manufactured than the semiconductor amplifier of which the diffraction grating is the concave grating. The reason for this is that in the case of the concave grating, an accurate grating must be formed on the concave surface, so that the manufacturing of the amplifier using the concave grating is difficult and the optical alignment is also difficult. Particularly, design of the etching mask for the concave grating is difficult since it contains a curvature surface.

Use of the arrayed optical waveguide of FIG. 32 provides a considerably large wavelength dispersive power, at least 100 times as large as that of the usual diffraction grating. For example, in the case of the concave grating, the number of channels formed is five channels at most, at the spacial interval of 10 nm, while in the case of the arrayed optical waveguide grating, a maximum of 500 channels can theoretically be formed at the spacial interval of 0.1 nm.

It is noted that the arrayed optical waveguide can be formed by only the process to fabricate the optical waveguide. When considering the optical integrated circuit, in the case of FIG. 30, after the optical waveguide is formed, a concave grating is formed by dry etching process. In the case of FIG. 32, the diffraction grating can also be formed by the process to fabricate the optical waveguide.

The wavelength multiple oscillator shown in FIGS. 32 and 33 may be constructed monolithically.

According to the invention, since the diameter of an optical fiber is not relevant to oscillating conditions, the spectral bandwidth of the laser beam to be oscillated can be narrowed. Since it is only the laser beams corresponding to the optical paths passing through the optical waveguides that oscillate, the coupling efficiency with the optical fiber can be improved. Further, a wavelength multiplex laser oscillator can be fabricated collectively as an optical integrated circuit, and in this case, not only the fabrication cost can be reduced but also the reliability can be improved.

In addition, the wavelength multiplex laser oscillator of the present invention can be applied not only for the optical communication but also for other applications such as PHB (Photo chemical HOle Burning) memories and optical measurements. The application of the present invention is not restricted.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular user contemplated. It is intended that the scope of the invention be defined by the claims appended hereto, and their equivalents.

What is claimed is:

1. A wavelength multiplex laser oscillator comprising:
   an optical waveguide having first and second light end faces;
   a plurality of laser amplifiers located within a laser amplifier array so that the optical axes of said laser amplifiers are parallel to one another, each of said plurality of laser amplifiers having first and second end faces and being driven independently of one another;
   a spectral optical system in an optical conjugate relationship with the first light end face of said laser amplifiers so that each said laser amplifier and said optical waveguide have an optical image forming relationship therebetween, and wherein said spectral optical system is optically between said optical waveguide and said laser amplifier array; and
   first and second reflecting means provided on the second light end faces of said optical waveguide and said laser amplifiers, respectively.

2. The wavelength multiplex laser oscillator according to claim 1, wherein said optical waveguide is an optical amplifier.

3. A wavelength multiplex laser oscillator comprising:
   an optical amplifier having first and second end faces;
   an optical modulator array having first and second end faces and containing a plurality of independently driven optical modulators, arranged so that the optical axes of said optical modulators are parallel to one another;
   a spectral optical system in an optical conjugate relationship with the first end face of said optical amplifier and the first end face of said optical modulator array, such that each said optical modulator and said optical amplifier have an optical image forming relationship therebetween, and wherein said spectral optical system is optically between said optical modulator and said optical modulator array; and
   first and second reflecting means provided on the second end faces of said optical amplifier and said optical modulator array, respectively.

4. A wavelength multiplex laser oscillator comprising:
   an optical waveguide having first and second end faces;
   a laser amplifier array having first and second end faces and including independently driven semiconductor laser amplifiers arranged so that the optical axes of said laser amplifiers are parallel to one another;
   a spectral optical system in which the first end face of said optical waveguide and the first end face of said laser amplifier array are positioned in and optical conjugate relationship, such that each of said semiconductor laser amplifiers and said optical waveguide are positioned so as to have an optical image forming relationship therebetween;
   a photo sensing element for monitoring intensity or power of light emitted from said second end face of said laser amplifier array and for controlling voltage applied to each said semiconductor laser amplifier; and
   first and second reflecting means provided on the second end faces of said optical waveguide and said laser amplifier array, respectively.

5. The wavelength multiplex laser oscillator according to claim 4, wherein said optical waveguide is an optical amplifier.

6. A wavelength multiplex laser oscillator comprising:
   an optical amplifier having first and second end faces;
   an optical modulator array having first and second end faces and including independently driven optical modulators arranged so that the optical axes of said optical modulators are parallel to one another;
   a spectral optical system in which the first end face of said optical amplifier and the first end face of said optical modulator array are arranged in an optical conjugate relationship, such that each said optical modulator and said optical amplifier are disposed so as to have an optical image forming relationship therebetween;
   a photo sensing element facing the second end face of said optical modulator array for monitoring emitted light intensity or power and for controlling voltage applied to each said optical modulator in response thereto; and
   first and second reflecting means formed on the second end faces of each said optical amplifier and said optical modulator array, respectively.

7. A wavelength multiplex laser oscillator comprising:
   an optical waveguide having first and second end faces;
   a laser amplifier array having first and second end faces; wherein independently driven semiconductor laser amplifiers are arranged in said laser amplifier array so that the optical axes of said laser amplifiers are parallel to one another;
   a spectral optical system having unequally distanced gratings wherein the first end face of said optical waveguide and the first end face of said laser amplifier array are directed so as to have an optical conjugate relationship therebetween, and said semiconductor laser amplifier and said optical waveguide are positioned so as to have an optical image forming relationship therebetween; and
   first and second reflecting means provided on the second end faces of said optical waveguide and said laser amplifier array.

8. The wavelength multiplex laser oscillator according to claim 7, wherein said optical waveguide is an optical amplifier.

9. A wavelength multiplex laser oscillator comprising:
   an optical amplifier having first and second end faces;
   an optical modulator array having first and second end faces wherein independently driven optical modulators are arranged such that the optical axes of said optical modulators are parallel to one another;

a spectral optical system having unequally distanced gratings wherein the first end face of said optical amplifier and the first end face of said optical modulator array are positioned so as to be in an optical conjugate relationship with the spectral optical system, and said optical modulator and said optical amplifiers are disposed so as to have an optical image forming relationship therebetween; and first and second reflecting means formed on the second end faces of said optical amplifier and said optical modulator array.

10. A wavelength multiplex laser oscillator comprising:

an optical waveguide having first and second end faces;

a laser amplifier array having first and second end faces and including independently driven laser amplifiers arranged so that the optical axes of said laser amplifiers are parallel to one another;

an arrayed waveguide diffraction grating having first and second end faces and a plurality of waveguides, each of said plurality of waveguides having a different optical path length;

first optical image-forming means for optically coupling the first end face of said diffraction grating and the first end face of said laser amplifier array; and second optical image,forming means for optically coupling the second end face of said diffraction grating and the first end face of said waveguide.

11. The wavelength multiplex laser oscillator according to claim 10, wherein said optical waveguide is an optical amplifier.

12. A wavelength multiplex laser oscillator comprising:

an optical amplifier having first and second end faces;

an optical modulator array having first and second end faces and including independently driven laser amplifiers arranged so that the optical axes of said laser amplifiers are parallel to one another;

an arrayed waveguide diffraction grating having first and second end faces and a plurality of waveguides, each of said plurality of waveguides having a different optical path length;

first optical image-forming means for optically coupling the first end face of said diffraction grating and the first end face of said modulator array; and second optical image-forming means for optically coupling the second end face of said diffraction grating and the first end face of said optical amplifier.

13. A wavelength multiplex laser oscillator comprising:

an optical waveguide having first and second end faces;

a laser amplifier array having first and second end faces and including independently driven laser amplifiers arranged so that the optical axes of said laser amplifiers are parallel to one another;

a spectral optical system in which the first end face of said optical waveguide and the first end face of said laser amplifier array are directed so as to be in an optical conjugate relationship with the spectral optical system and each of said laser amplifiers and said optical waveguide are positioned so as to have an optical image forming relationship therebetween; and an output optical waveguide branched from said spectral optical system.

14. A wavelength multiplex laser oscillator comprising:

an optical amplifier having first and second end faces;

an optical modulator array having first and second end faces and including independently driven optical modulators arranged so that the optical axes of said optical modulators are parallel to one another;

a spectral optical system in which the first end face of said optical amplifier and the first end face of said optical modulator array are directed so as to be in an optical conjugate relationship with the spectral optical system, and each said optical modulator and said optical amplifier are disposed so as to have an optical image forming relationship therebetween; and an output optical waveguide branched from said spectral optical system.

* * * * *

UNITED STATES PATENT AND TRADEMARK OFFICE
CERTIFICATE OF CORRECTION

PATENT NO. : 5,570,226
DATED : October 29, 1996
INVENTOR(S) : Takeshi OTA

It is certified that error appears in the above-indentified patent and that said Letters Patent is hereby corrected as shown below:

In the abstract, line 3, "optical an link" should read --an optical link--.

In the abstract, line 6, "an wavelength" should read --a wavelength--.

Claim 7, column 24, line 54, "amplifier" should read --amplifiers--.

Claim 10, column 25, line 28, "image,forming" should read --image-forming--.

Claim 13, column 26, line 19, "system" should read --system,--.

Signed and Sealed this

Eighteenth Day of March, 1997

Attest:

BRUCE LEHMAN

Attesting Officer

Commissioner of Patents and Trademarks